United States Patent
Fujii et al.

(10) Patent No.: US 10,094,024 B2
(45) Date of Patent: Oct. 9, 2018

(54) METHOD OF MANUFACTURING MULTILAYER BODY, METHOD OF PROCESSING SUBSTRATE, AND MULTILAYER BODY

(75) Inventors: Yasushi Fujii, Kawasaki (JP); Tatsuhiro Mitake, Kawasaki (JP); Atsushi Matsushita, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 688 days.

(21) Appl. No.: 14/127,315

(22) PCT Filed: May 31, 2012

(86) PCT No.: PCT/JP2012/064239
§ 371 (c)(1),
(2), (4) Date: Dec. 18, 2013

(87) PCT Pub. No.: WO2012/176607
PCT Pub. Date: Dec. 27, 2012

(65) Prior Publication Data
US 2014/0141253 A1   May 22, 2014

(30) Foreign Application Priority Data

Jun. 24, 2011 (JP) ................. 2011-141267

(51) Int. Cl.
*C23C 16/50* (2006.01)
*H01L 21/02* (2006.01)
(Continued)

(52) U.S. Cl.
CPC .............. *C23C 16/50* (2013.01); *C23C 16/26* (2013.01); *C23C 16/505* (2013.01);
(Continued)

(58) Field of Classification Search
CPC ....... C23C 16/50; C23C 16/505; C23C 16/26; H01L 21/6835; H01L 21/02274;
(Continued)

(56) References Cited

U.S. PATENT DOCUMENTS 4,631,198 A * 12/1986 Kakinuma .............. C23C 16/24
257/E21.101
5,366,585 A * 11/1994 Robertson ........... C23C 16/4404
134/1
(Continued)

FOREIGN PATENT DOCUMENTS

JP           3116904          10/2000
JP         2002-100623         4/2002
(Continued)

OTHER PUBLICATIONS

Translation of JP2005-183689.*
(Continued)

*Primary Examiner* — Michael P Wieczorek
*Assistant Examiner* — Michael G Miller
(74) *Attorney, Agent, or Firm* — Knobbe Martens Olson & Bear LLP

(57) ABSTRACT

A method for forming a release layer which lies between a substrate and a supporting member and has a property that changes when the release layer absorbs light coming through the supporting member, by carrying out plasma CVD with a high-frequency power that is set so as to be higher than a power at which a mode jump occurs.

7 Claims, 27 Drawing Sheets

(51) Int. Cl.
*H01L 21/683* (2006.01)
*C23C 16/26* (2006.01)
*C23C 16/505* (2006.01)

(52) U.S. Cl.
CPC .... *H01L 21/0212* (2013.01); *H01L 21/02274* (2013.01); *H01L 21/6835* (2013.01); *H01L 2221/6834* (2013.01); *H01L 2221/68318* (2013.01); *H01L 2221/68327* (2013.01); *H01L 2221/68331* (2013.01); *H01L 2221/68381* (2013.01); *Y10T 428/31504* (2015.04)

(58) Field of Classification Search
CPC ....... H01L 21/0212; H01L 2221/68331; H01L 2221/68318; H01L 2221/6834; H01L 2221/68327; H01L 2221/68381; Y10T 428/31504
USPC .................................................. 427/569–579
See application file for complete search history.

(56) References Cited

U.S. PATENT DOCUMENTS

| | | |
|---|---|---|
| 6,149,730 A | 11/2000 | Matsubara et al. |
| 2002/0069827 A1 | 6/2002 | Sakamoto et al. |
| 2003/0047280 A1 | 3/2003 | Takayama et al. |
| 2003/0183898 A1 | 10/2003 | Ohashi |
| 2005/0233547 A1 | 10/2005 | Noda et al. |
| 2007/0145494 A1 | 6/2007 | Ohashi |
| 2009/0042356 A1 | 2/2009 | Takayama et al. |
| 2009/0133812 A1 | 5/2009 | Noda et al. |
| 2009/0291516 A1 | 11/2009 | Takayama et al. |
| 2010/0038035 A1 | 2/2010 | Noda et al. |
| 2010/0041211 A1 | 2/2010 | Noda et al. |
| 2011/0297771 A1 | 12/2011 | Noda et al. |
| 2012/0217501 A1 | 8/2012 | Takayama et al. |
| 2013/0220554 A1* | 8/2013 | Inao .................... H01L 21/6835 156/712 |
| 2014/0264351 A1 | 9/2014 | Takayama et al. |

FOREIGN PATENT DOCUMENTS

| | | | | |
|---|---|---|---|---|
| JP | 2002-373871 | | 12/2002 | |
| JP | 2003-163338 | | 6/2003 | |
| JP | 2004-64040 | | 2/2004 | |
| JP | 2005-183689 | | 7/2005 | |
| JP | 2005183689 A | * | 7/2005 | |
| JP | 2005-212103 | | 8/2005 | |
| JP | 3975099 | | 6/2007 | |
| TW | 558743 | | 10/2003 | |
| WO | WO-2012056803 A1 | * | 5/2012 | ......... H01L 21/6835 |

OTHER PUBLICATIONS

Mullerova et al ("Optical characterization of polysilicon thin films for solar applications", J. Mullerova et al, Solar Energy, article in press 2006).*

International Search Report issued in PCT/JP2012/064239 dated Aug. 21, 2012.

* cited by examiner

METHOD OF MANUFACTURING MULTILAYER BODY, METHOD OF PROCESSING SUBSTRATE, AND MULTILAYER BODY

This application is the U.S. National Phase under 35 U.S.C. § 371 of International Application No. PCT/JP2012/064239, filed May 31, 2012, designating the U.S., and published in Japanese as WO 2012/176607 on Dec. 27, 2012, which claims priority to Japanese Patent Application No. 2011-141267, filed Jun. 24, 2011, the entire content of which is incorporated herein by reference.

TECHNICAL FIELD

The present invention relates to a method for manufacturing (producing) a multilayer body (laminate), a method for processing a substrate, and a multilayer body (laminate). Specifically, the present invention relates to (i) a method for producing a laminate including a substrate, a supporting member and a release layer, (ii) a method for processing the substrate which method includes the step of producing the laminate, and (iii) the laminate.

BACKGROUND ART

As mobile phones, digital AV devices, IC cards and the like are highly functionalized, it is more demanded that a semiconductor silicon chip (hereafter referred to as "chip") be highly integrated in a package by making a mounted chip smaller and thinner. For instance, there is a demand for thinning of an integrated circuit obtained by packaging a plurality of chips, such as CSP (chip size package) and MCP (multi-chip package). In order to fulfill high integration of a chip in a package, it is necessary to thin a chip down to a range of 25 µm to 150 µm.

However, a semiconductor wafer (hereafter referred to as "wafer") serving as a base of a chip becomes thin by grinding. Therefore, strength of the wafer decreases. This is likely to result in a crack or a warpage in the wafer. Furthermore, it is difficult to automatically carry the wafer whose strength decreases due to its smaller thickness. Therefore, it is necessary to manually carry the wafer and it is troublesome to handle the wafer.

For this reason, there has been developed a wafer handling system for reinforcement of a wafer, by which to bond a plate-like member called "support plate" which is composed of glass, silicon, hard plastic or the like, to a wafer to be ground, thereby preventing a crack and a warpage in the wafer. Since such a wafer handling system can reinforce a wafer, it is possible to automatically carry a semiconductor wafer having been made thinner.

In the wafer handling system, (i) a wafer and a support plate are bonded (temporarily attached) together with the use of various kinds of thermoplastic resins or adhesives, (ii) the wafer bonded to the support plate is thinned, and then (iii) the support plate is separated from the wafer prior to dicing of the wafer.

Patent Literature 1 discloses a technique by which to suitably attach the support plate to the wafer temporarily and suitably separate the support plate from the wafer. The technique disclosed in Patent Literature 1 uses a laminate which (i) is constituted by a grinding target base, an adhesive layer in contact with the grinding target base, a light-heat conversion layer containing a light absorbing agent and a pyrolytic resin, and a light-transmitting supporting member and (ii) is arranged such that, when the light-heat conversion layer is irradiated with radiant energy after the surface of the grinding target base which surface is opposite to the adhesive layer is ground, the light-heat conversion layer is pyrolyzed so that the ground base and the light-transmitting supporting member are separated from each other. In a case where the support plate (supporting member) is temporarily attached to the wafer (base) by utilizing such a laminate, the wafer and the support plate can be easily separated from each other by irradiating the light-heat conversion layer with light.

CITATION LIST

Patent Literature

Patent Literature 1
Japanese Patent Application Publication, Tokukai, No. 2004-64040 A (Publication Date: Feb. 26, 2004)

SUMMARY OF INVENTION

Technical Problem

However, according to the technique disclosed in Patent Literature 1, the light-heat conversion layer is formed by spin coating. Therefore, it takes time to form the light-heat conversion layer, and there are problems of running costs and waste fluids etc. Therefore, it is very beneficial to provide a technique by which it is possible to more suitably produce a laminate as described above.

The present invention has been made in view of the above problems, and a main object of the present invention is to provide a technique to suitably produce a laminate to be utilized to temporarily attach a supporting member to a substrate.

Solution to Problem

A method for producing a laminate in accordance with the present invention is a method for producing the laminate including (i) a substrate, (ii) a light-transmitting supporting member which supports the substrate and (iii) a release layer which lies between the substrate and the supporting member and has a property that changes when the release layer absorbs light coming through the supporting member, said method including the step of forming the release layer by plasma CVD using a reactive gas containing a hydrocarbon gas and/or a fluorocarbon gas, the step of forming the release layer including carrying out the plasma CVD with a high-frequency power that is set so as to be higher than a power at which a mode jump occurs.

A laminate in accordance with the present invention includes: a substrate; a light-transmitting supporting member which supports the substrate; and a release layer which lies between the substrate and the supporting member and has a property that changes when the release layer absorbs light coming through the supporting member, the release layer (i) being formed by plasma CVD using a reactive gas containing a hydrocarbon gas and/or a fluorocarbon gas and (ii) having a pencil hardness of HB or greater.

Advantageous Effects of Invention

According to the present invention, it is possible to provide a technique of, when producing a laminate including (i) a substrate, (ii) a light-transmitting supporting member which supports the substrate and (iii) a release layer which lies between the substrate and the supporting member and has a property that changes when the release layer absorbs light coming through the supporting member, suitably forming the release layer of the laminate, and also possible to provide the laminate including the release layer having a pencil hardness of HB or greater.

DESCRIPTION OF EMBODIMENTS

The present invention provides a method for producing a laminate, a method for processing a substrate, and a laminate. The laminate in accordance with the present invention is useful as a structure to be utilized to temporarily attach a substrate to a supporting member, and its use is not particularly limited. For example, the laminate in accordance with the present invention is suitable for use in the following method for processing a substrate: in a wafer support system, a semiconductor wafer (substrate) is temporarily attached to this support plate (supporting member), and then the semiconductor wafer is thinned and provided with back wiring, etc.

In order to attain the above method for producing a laminate, the inventors of the present invention have conducted, on the basis of their original idea, a study to form a release layer of the laminate by plasma CVD. As a result, the inventors have found that, by carrying out plasma CVD with a high-frequency power that is set so as to be higher than a power at which a mode jump occurs, it is possible to more suitably produce a high-quality laminate as compared to a layer formation technique using general plasma CVD (for example, a technique disclosed in Japanese Patent Application Publication, Tokukaihei, No. 11-251308). On the basis of this finding, the inventors have accomplished the present invention.

The following description will discuss one embodiment of the present invention with reference to the drawings.

Figure 1:
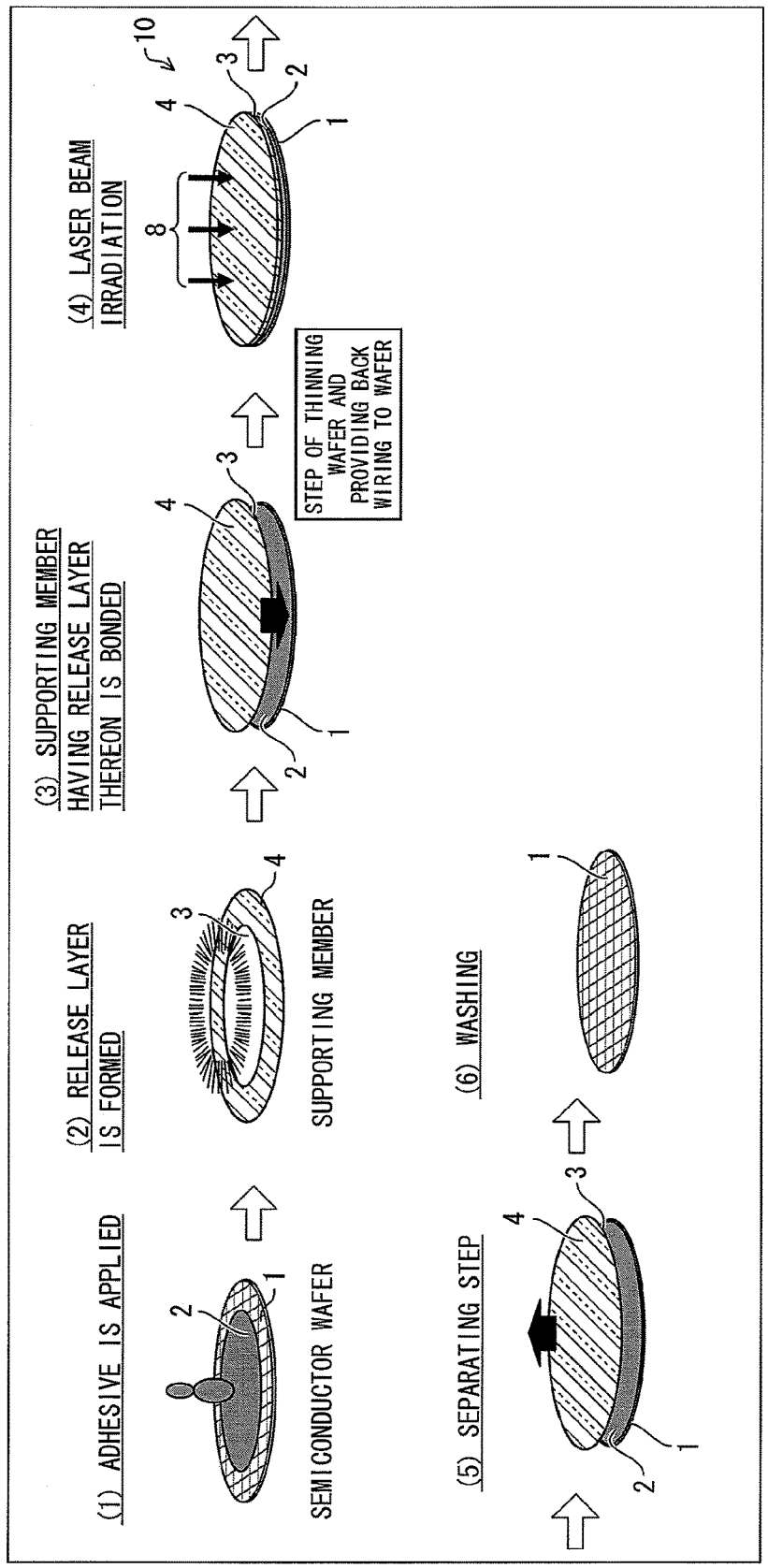
FIG. 1 illustrates a method for processing a substrate in accordance with one embodiment of the present invention.

FIG. 1 illustrates the steps of a method for processing a substrate in accordance with one embodiment of the present invention. As illustrated in FIG. 1, the method for processing a substrate in accordance with the present embodiment includes (1) an adhesive layer forming step, (2) a release layer forming step (the step of forming a release layer), (3) a bonding step, (4) an irradiating step, (5) a separating step and (6) a washing step. Of these steps, the adhesive layer forming step, the release layer forming step and the bonding step constitute a method for producing a laminate in accordance with the present embodiment. The following description discusses each of the steps in detail.

[1: Adhesive Layer Forming Step]

(1) of FIG. 1 illustrates the adhesive layer forming step. In the adhesive layer forming step, an adhesive layer 2 is formed on a surface of a substrate 1 which surface is to be supported by a supporting member 4. The substrate 1 is not particularly limited, and can be, for example, a semiconductor wafer. Alternatively, the substrate 1 may be any substrate that should be supported by a support plate, e.g., a ceramic substrate, a thin film substrate or a flexible substrate. The surface of the substrate 1, which surface is to be supported by the supporting member 4, is, in other words, the surface opposite to a side of a laminate 10 which side is to be subjected to processing (such as thinning and back wiring). The surface of the substrate 1, which surface is to be supported by the supporting member 4, can be, for example, a surface of the substrate 1 on which surface desired elements are provided.

(Adhesive Layer)

The adhesive layer 2 serves to bond and fix the substrate 1 to the supporting member 4 and also to cover the surface of the substrate 1 to thereby protect the surface of the substrate 1. Therefore, the adhesive layer 2 has enough adhesion and strength to fix the substrate 1 to the supporting member 4 and to keep covering the surface, which is to be protected, of the substrate 1 while the substrate 1 is processed or transported. At the same time, the adhesive layer 2 should be easily separated or removed from the substrate 1 when the substrate 1 no longer has to be fixed to the supporting member 4.

To this end, the adhesive layer 2 is constituted by an adhesive (i) that usually has strong adhesion and (ii) whose adhesion decreases when the adhesive is subjected to a certain treatment or which is soluble in a particular solvent. Examples of the adhesive which constitutes the adhesive layer 2 include various adhesives known in this field, such as acrylic adhesives, novolac adhesives, naphthoquinone adhesives, hydrocarbon adhesives, styrene resins, maleimide resins, elastomer adhesives and polyimide adhesives. The adhesive can be applied by, for example, spin coating, dipping, roller blade method, doctor blade method, spraying, or applying with the use of a slit nozzle.

It is preferable that the adhesive layer 2 is made from a resin other than photo-curable resin (e.g., UV-curable resin). This is because, after the adhesive layer 2 is separated or removed from the substrate, the photo-curable resin may remain as a residue around minute protrusions on the substrate. It is particularly preferable that the adhesive layer 2 is made from an adhesive that is soluble in a particular solvent. This is because such an adhesive layer 2 can be removed by dissolving the adhesive layer 2 in the solvent without applying physical forces to the substrate 1. This makes it possible to easily remove the adhesive layer 2 from the substrate 1 without damaging or deforming the substrate 1 even if the substrate 1 has a decreased strength.

According to the present embodiment, in the adhesive layer forming step, the adhesive is applied to the surface of the substrate 1 which surface is to be supported by the supporting member 4 (see (1) of FIG. 1). The adhesive applied to the substrate 1 here is, for example, dissolved in a solvent. Then, the adhesive is baked in stages while the temperature is raised, whereby the adhesive is hardened. In this way, the adhesive layer 2 can be formed.

In another embodiment, a film having adhesive applied to its both surfaces (so-called double-sided (adhesive) tape) may be attached to the substrate 1, instead of the adhesive directly applied to the substrate 1.

[2: Release Layer Forming Step]

(2) of FIG. 1 illustrates the release layer forming step. The release layer forming step includes forming a release layer 3 on the supporting member 4. It should be noted that the adhesive layer forming step and the release layer forming step need only be completed before the start of the bonding step (described later). The order in which the adhesive layer forming step and the release layer forming step are carried out is not limited, and these steps can be carried out at in parallel with each other.

(Supporting Member)

The following description discusses the supporting member 4. The supporting member 4 is light-transmissive so that light 8 coming from the outside of the laminate 10 passes through the supporting member 4 and reaches the release layer 3 in the separating step (described later). On this account, the supporting member 4 does not have to be transparent to light of all kinds, and therefore need only be transparent to light that should be absorbed by the release layer 3 (i.e., light that has a desired wavelength). Examples of the light that should be absorbed by the release layer 3 include, but are not limited to, light having a wavelength of 2 μm or less, such as (i) laser beams produced by (a) solid-state lasers such as a YAG laser, a ruby laser, a glass laser, a $YVO_4$ laser, an LD laser, and a fiber laser, (b) liquid lasers such as a dye laser, (c) gas lasers such as a $CO_2$ laser, an excimer laser, an Ar laser, and an He—Ne laser, (d) semiconductor lasers, and (e) free electron lasers and (ii) light other than laser beams. The wavelength of the light that should be absorbed by the release layer 3 can be, but is not limited to, 600 nm or less, for example. When seen from a different point of view, the light that should be absorbed by the release layer 3 is preferably, for example, light 80 percent or more of which is absorbed by the release layer 3.

The supporting member 4 is configured to support the substrate 1. Therefore, the supporting member 4 need only have enough strength to prevent damages and deformation of the substrate 1 when the substrate 1 is processed or transported etc.

The supporting member 4 is made from, for example, glass or silicon. Note, however, that any material can be used to make the supporting member 4, provided that the above objectives are achieved.

(Release Layer)

The release layer 3 has a property that changes when the release layer 3 absorbs light. In this specification, the phrase "release layer 3 changes its property" means bringing about (i) a state in which the release layer 3 is readily broken when a little external force is applied thereto or (ii) a state in which the adhesion is weak between the release layer 3 and a member (e.g., the supporting member 4) in contact with the release layer 3. In the separating step (described later), the release layer 3 changes its property upon receiving light, and thereby loses the strength or adhesion that it had before receiving light. Therefore, the substrate 1 is easily separated from the supporting member 4 by applying a little external force (for example, by lifting up the supporting member 4) because the release layer 3 is broken by the little external force.

According to the present embodiment, the release layer forming step includes forming the release layer 3 on the supporting member 4 by plasma CVD (as illustrated in (2) of FIG. 1).

Figure 3:
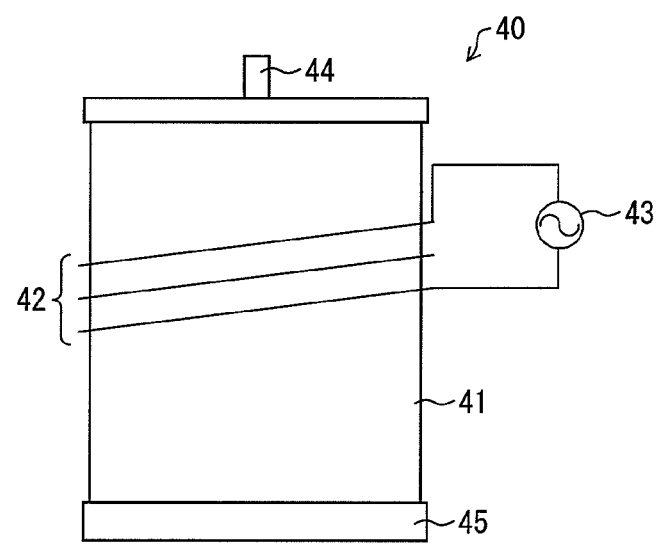
FIG. 3 schematically illustrates an example of a plasma processing apparatus.

A plasma processing apparatus used in plasma CVD can be a known plasma processing apparatus and can be, for example, a plasma processing apparatus as illustrated in FIG. 3. A plasma processing apparatus 40 illustrated in FIG. 3 is an example of the plasma processing apparatus that can be used in the present embodiment, and includes a reaction chamber 41, a coiled electrode 42, a high-frequency power source 43, a reactive gas supply port 44 and a base 45.

The shape of the reaction chamber 41 is not particularly limited. The reaction chamber 41 may be in the shape of a cylinder as illustrated in FIG. 3 or may be in some other shape such as a dome. The size of the reaction chamber 41 may be selected appropriately according to the size of the substrate 1 to be processed.

There are two kinds of plasma generated in the plasma processing apparatus 40: capacitively coupled plasma (CCP) caused by an electrostatic field generated by applying high-frequency power to the coiled electrode 42; and inductively coupled plasma (ICP) caused by an induction field generated by a high-frequency current passing through the coiled electrode 42.

Figure 4:
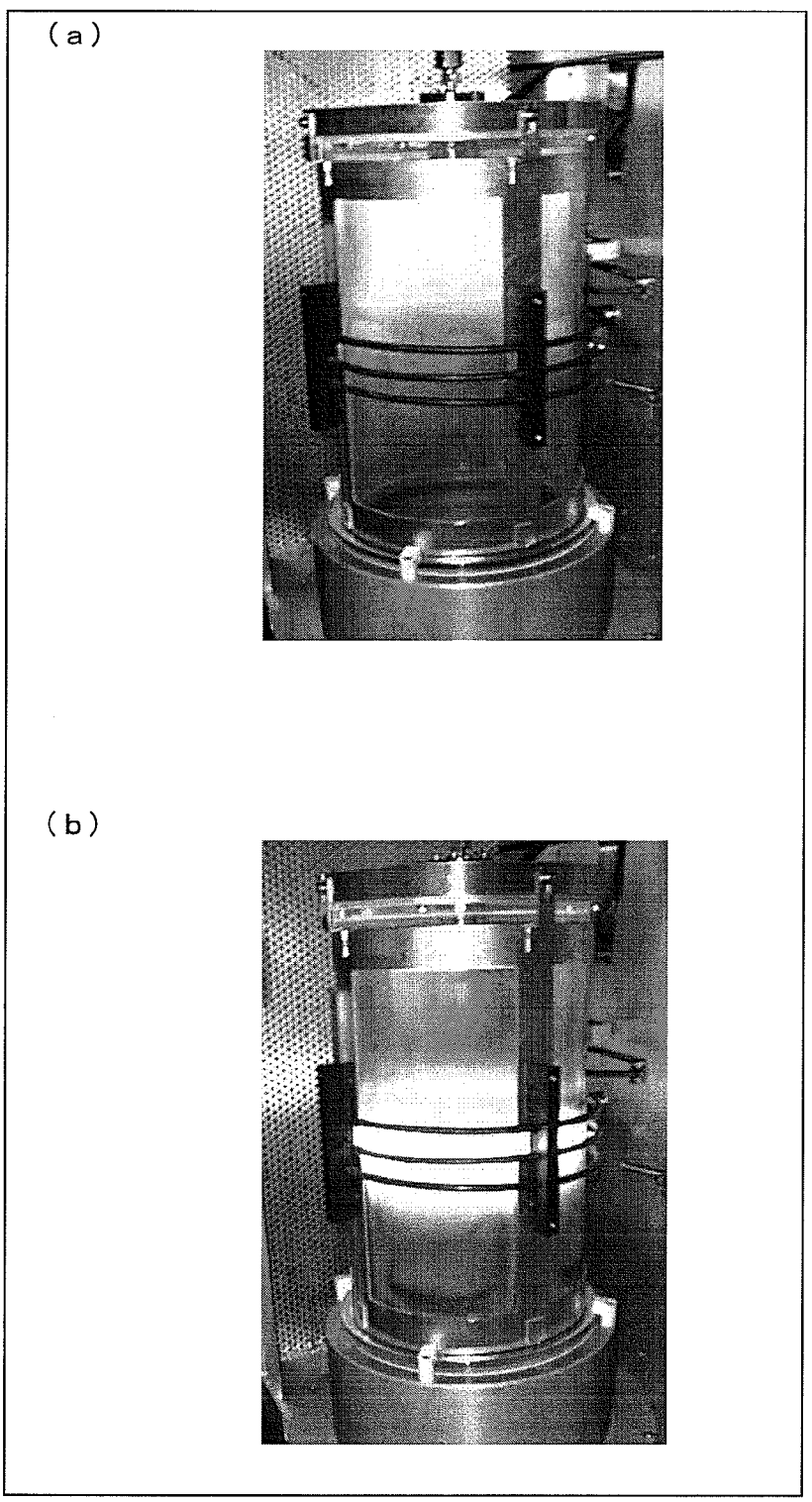
FIG. 4 shows how the plasma processing apparatus looks when plasma in each mode occurs. (a) of FIG. 4 illustrates how the plasma processing apparatus looks when E-mode plasma occurs, whereas (b) of FIG. 4 illustrates how the plasma processing apparatus looks when H-mode plasma occurs.

Plasma most of which is capacitively coupled plasma (such plasma is called E-mode plasma) typically occurs when plasma density is low, whereas plasma most of which is inductively coupled plasma (such plasma is called H-mode plasma) typically occurs when plasma density is high. (a) of FIG. 4 illustrates how E-mode plasma occurs, whereas (b) of FIG. 4 illustrates how H-mode plasma occurs. Transition from E mode to H mode depends on the plasma density. When the plasma density becomes equal to or higher than a certain level, power input to the plasma suddenly increases. This phenomenon is generally called "mode jump" or "density jump". That is, plasma that occurs when the applied power is equal to or lower than a power at which a mode jump occurs is E-mode plasma, whereas plasma that occurs when the applied power is higher than the power at which a mode jump occurs is H-mode plasma (see for example Japanese Patent No. 3852655, Japanese Patent No. 4272654, etc.)

In a preferable embodiment, H-mode plasma can be dense plasma. It should be noted here that the dense plasma means plasma having an electron density of $1 \times 10^{11}$ cm$^{-3}$ or greater.

Whether a mode jump has occurred or not can be determined by measuring the ion density of plasma or can be easily determined from the appearance of the plasma processing apparatus 40 as shown in FIG. 4. For example, as shown in (b) of FIG. 4, after a mode jump has occurred, strong light emission is observed near the coiled electrode 42.

(High-frequency Power)

In the present embodiment, the high-frequency power applied to the coiled electrode 42 is set so as to be higher than a power at which a mode jump occurs. This brings about the following remarkable effect: it is possible to improve the speed of formation of the release layer 3, the hardness of the release layer 3, and the light-blocking property of the release layer 3 (refer to Examples described later).

The power at which a mode jump occurs may be determined appropriately according to the size of the substrate and the structure of the electrode. The power is, for example, 1000 W to 3000 W.

That is, according to the present embodiment, it is possible to improve the speed of formation of the release layer 3 to thereby reduce the time taken to form the release layer 3.

Furthermore, since the present embodiment makes it possible to improve the hardness of the release layer 3, it is possible to reduce the possibility that scratches will result on the release layer 3 when the release layer 3 and the adhesive layer 2 are bonded together in the bonding step. If the release layer 3 has a scratch, problems may occur in the subsequent steps. Therefore, reducing the possibility of scratches on the release layer 3 is very advantageous. In particular, when the release layer 3 has a pencil hardness of HB or greater, it is possible to successfully prevent scratches on the release layer 3 in the bonding step. The release layer 3 which has such a hardness cannot be formed by a layer formation technique using general plasma CVD (for example, a technique disclosed in Japanese Patent Application Publication, Tokukaihei, No. 11-251308). The release layer 3 which has such a hardness can be formed only by the present invention.

It should be noted that, in this specification, the "pencil hardness" means hardness determined by a method described later in Examples. That is, the "pencil hardness" means hardness in which, even if the release layer 3 is scratched with the use of a pencil having a particular hardness in a predetermined manner, no large scratches result on the release layer 3.

Furthermore, since the present embodiment makes it possible to improve the light-blocking property of the release layer 3, it is possible to successfully prevent damages to the substrate 1 in the irradiating step. Specifically, in the irradiating step, the release layer 3 is irradiated with the light 8 coming through the supporting member 4 (this step is described later). When the release layer 3 has an increased light-blocking property, the light 8 which has passed through the supporting member 4 is blocked by the release layer 3 and thus does not reach the substrate 1. This makes it possible to prevent the light 8 from reaching the substrate 1 and thus possible to successfully prevent the structures on the substrate 1 from being damaged by the light 8.

The high-frequency power at which a mode jump occurs differs depending on the size and shape of the plasma processing apparatus 40, the type of the reactive gas, pressure, etc. Therefore, it is preferable to carry out a measuring step in advance by which to previously determine the high-frequency power at which a mode jump occurs. In the measuring step, the high-frequency power at which a mode jump occurs can be successfully determined by, while changing high-frequency power, checking the appearance of the plasma processing apparatus 40 or measuring the ion density in the reaction chamber 41.

(Reactive Gas)

The reactive gas to be supplied into the reaction chamber 41 can be a gas containing a fluorocarbon gas and/or a hydrocarbon gas. Plasma CVD using as a material gas(es) a fluorocarbon gas and/or a hydrocarbon gas makes it possible to suitably form the release layer 3.

Examples of a fluorocarbon gas include $C_xF_y$ and $C_xH_yF_z$ (x, y and z are each a natural number). More specifically, examples of a fluorocarbon gas include, but are not limited to, $CHF_3$, $CH_2F_2$, $C_2H_2F_2$, $C_4F_8$, $C_2F_6$, and $C_5F_8$. Examples of a hydrocarbon gas include alkanes such as $CH_4$, alkenes such as ethylene, and alkines such as acetylene.

Furthermore, one or more of the following additive gases may be added to the reactive gas: inert gases such as nitrogen, helium and argon; hydrocarbon gases such as alkanes, alkenes and alkines; fluorocarbon gases; hydrogen; and oxygen. The amount of the additive gas(es) is not particularly limited. For example, in a case where hydrogen is added, it is preferable that the amount of hydrogen relative to the total amount of the reactive gas is, for example, but is not limited to, not less than 5% or but more than 20%. As for oxygen, it is preferable that the amount of oxygen is, but is not limited to, an extremely small amount, or no oxygen is added.

The reactive gas can contain a fluorocarbon gas as a main component. In this case, it is preferable that the reactive gas contains a hydrocarbon gas as an additive gas. This makes it possible to improve the speed of formation of the release layer 3 and the light-blocking property of the release layer 3 as compared to a case where the fluorocarbon gas alone is used as a material gas. It is preferable here that the amount of the hydrocarbon gas relative to the total amount of the reactive gas is, for example, not less than 5% but not more than 20%. On the other hand, in a case where the reactive gas contains a hydrocarbon gas as a main component, it is preferable that the reactive gas contains a fluorocarbon gas as an additive gas. The main component means the gas that accounts for the largest proportion (percent by volume) of the reactive gas.

Furthermore, an appropriate amount of an inert gas(es) can be added to the reactive gas so that the material gases are suitably mixed and a resulting release layer 3 will have a uniform thickness.

The flow rate of the reactive gas (the amount of the reactive gas supplied to the reaction chamber 41) is not particularly limited, and can be set to various levels. The flow rate can be, for example, 10 ml/min to 1000 ml/min, more specifically, 100 ml/min to 500 ml/min. The pressure in the reaction chamber 41 is not particularly limited either, and can be set to various levels. The pressure can be, for example, 0.1 Pa to 1500 Pa, preferably 1 Pa to 100 Pa, and more preferably 10 Pa to 70 Pa, specifically 67 Pa (500 mTorr) or 70 Pa.

The thickness of the release layer 3 is not particularly limited, provided that the release layer 3 sufficiently absorbs light used here. It is more preferable that the thickness is, for example, 0.05 µm to 100 µm, and particularly preferably 0.1 µm to 5 µm. In the release layer forming step, the period over which the release layer 3 is formed can be, for example, about 1 minute to 30 minutes, preferably about 5 minutes to 20 minutes, and more preferably about 5 minutes to 15 minutes, except for cleaning period(s). The release layer 3 may be formed by plasma CVD at a time. Alternatively, the release layer 3 may be formed by plasma CVD in stages under different conditions, e.g., with the use of reactive gases having different compositions.

In the release layer forming step, it is preferable that a surface of the release layer 3 which surface is to contact the adhesive layer 2 is flat (i.e., has no protrusions). Such a release layer 3 can be formed easily by plasma CVD. Such a release layer 3 can be easily bonded to the adhesive layer 2 in a uniform manner in the bonding step.

The release layer 3 does not necessarily have to be formed directly on the supporting member 4. For example, in another embodiment, in the release layer forming step, the release layer 3 can be formed on another layer on the supporting member 4. In this case, the another layer is made of a light-transmitting material. Therefore, it is possible to add, as needed, a layer (another layer) that gives a desirable property etc. to the laminate 10, without preventing light from reaching the release layer 3 in the separating step (describe later). The another layer can be, for example, an adhesive layer with which the release layer 3 and the supporting member 4 are bonded together.

It should be noted that the wavelength of light that is capable of changing a property of the release layer 3 may differ depending on the type of an organic material constituting the release layer 3. Therefore, the material(s) constituting the another layer does not have to transmit light of all kinds. The material(s) constituting the another layer can be selected as appropriate from those which are capable of transmitting the wavelength of light that should be absorbed by the release layer 3.

(Temperature at which Layer is Formed)

The temperature at which a layer is formed (such a temperature is hereinafter referred to as layer formation temperature) can be selected in view of various conditions. In this specification, the "layer formation temperature" means the temperature of a stage, on which the supporting member 4 is placed, in a plasma processing apparatus for use in plasma CVD.

Specifically, in order to improve the degassing property of the release layer 3 (i.e., in order to reduce the amount of gas lost from the release layer 3), it is preferable that the layer formation temperature in the release layer forming step is higher than ambient temperature in steps subsequent to the release layer forming step. By forming the release layer 3 at such a layer formation temperature, it is possible to improve the degassing property. In this case, the layer formation temperature can be, for example, 120° C. or higher.

On the other hand, in order to improve the speed of the formation of the release layer 3 and the light-blocking property of the resulting release layer 3, the layer formation temperature in the release layer forming step is preferably 300° C. or lower, and more preferably not lower than 100° C. but not higher than 240° C. By forming the release layer 3 at a layer formation temperature falling within this range, it is possible to more quickly form the release layer 3 in the release layer forming step and to improve the light-blocking property of the obtained release layer 3.

(Material for Reaction Chamber)

The reaction chamber 41 used here can be a typical reaction chamber made of quartz. Note, however, that it is more preferable that the reaction chamber 41 is a reaction chamber made of ceramics. In a case where the reaction chamber 41 is made of quartz, the quartz constituting the reaction chamber may be etched and generate oxygen during plasma CVD, which may result in adverse effects. On the other hand, in a case where the reaction chamber 41 is made of ceramics, the generation of oxygen during plasma CVD is prevented, whereby the release layer 3 is suitably formed.

[3: Bonding Step]

(3) of FIG. 1 illustrates the bonding step. The bonding step includes producing the laminate 10, which is constituted by the substrate 1, the adhesive layer 2, the release layer 3 and the supporting member 4 stacked in this order, by bonding the adhesive layer 2 formed on the substrate 1 to the release layer 3 formed on the supporting member 4. As described earlier, there may be another layer between any of the above layers.

Layers may be bonded together by a known method. For example, they can be bonded together under pressure at a high temperature of about 200° C. to 300° C. in vacuum.

It should be noted that, although the present embodiment discussed a method by which to form the adhesive layer 2 on the substrate 1 and bond the adhesive layer 2 to the release layer 3 formed on the supporting member 4, the present invention is not limited to such. For example, it is also possible to employ a method by which to form the release layer 3 on the supporting member 4, form the adhesive layer 2 on the release layer 3, and then bond the adhesive layer 2 and the substrate 1 together.

The release layer 3 can also serve as an adhesive layer. Specifically, it is also possible to produce the laminate 10 by forming the release layer 3 on the supporting member 4 and then directly bonding the release layer 3 and the substrate 1 together.

Figure 2:
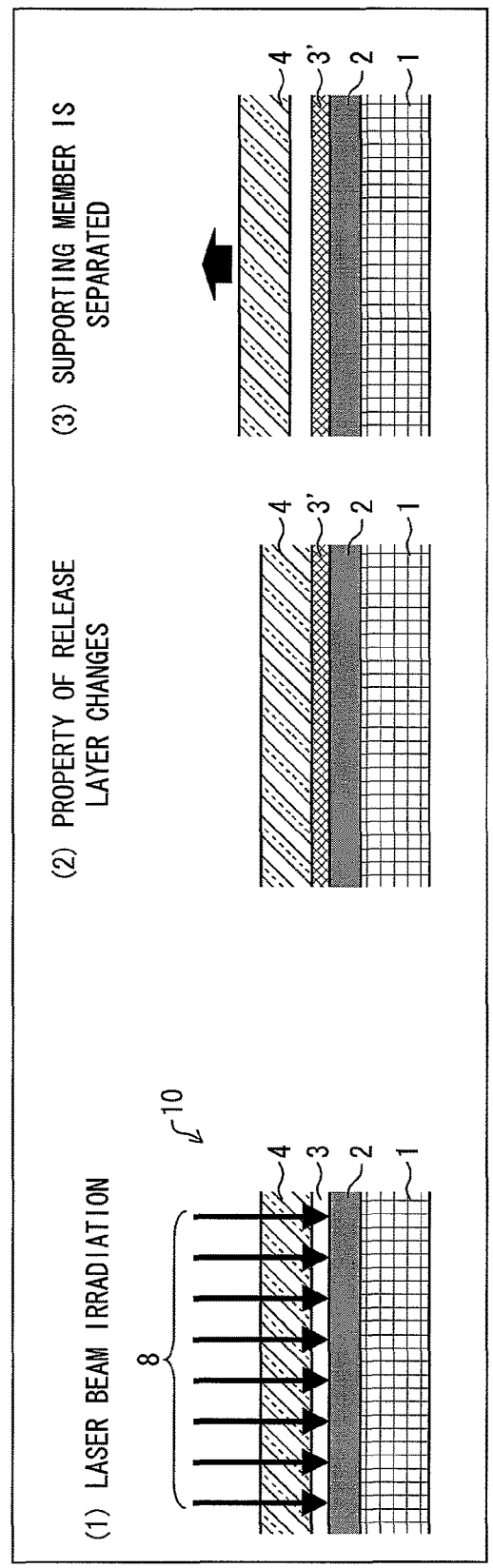
FIG. 2 illustrates in detail the irradiating step and the separating step in accordance with one embodiment of the present invention.

By the steps having been described, the laminate 1 in accordance with the present embodiment is formed. According to the method for processing a substrate in accordance with the present embodiment, after the laminate 10 is produced, the substrate 1 of the laminate 10 is subjected to desirable processing such as thinning, back wiring etc., and thereafter the laminate 10 is separated to recover the substrate 1. The following description discusses subsequent steps with reference to FIGS. 1 and 2. FIG. 2 illustrates the irradiating step and the separating step in more detail.

[4: Irradiating Step]

(4) of FIG. 1 and (1) and (2) of FIG. 2 illustrate the irradiating step. In the irradiating step, the release layer 3 is irradiated with the light 8 coming through the supporting member 4 and thereby a property of the release layer 3 is changed. The light 8 with which the release layer 3 is irradiated may be appropriately selected, according to the wavelength that the release layer 3 absorbs, from, for example, (i) laser beams produced by (a) solid-state lasers such as a YAG laser, a ruby laser, a glass laser, a $YVO_4$ laser, an LD laser, and a fiber laser, (b) liquid lasers such as a dye laser, (c) gas lasers such as a $CO_2$ laser, an excimer laser, an Ar laser, and an He—Ne laser, (d) semiconductor lasers, and (e) free electron lasers and (ii) light other than laser beams. The wavelength of light that should be absorbed by the release layer 3 can be, but is not limited to, for example light having a wavelength of 600 nm or less. When seen from a different point of view, the light that should be absorbed by the release layer 3 is preferably light 60 percent of which is absorbed by the release layer 3, more preferably light 80 percent of which is absorbed by the release layer 3.

The light 8, with which the release layer 3 is irradiated, may travel perpendicularly to a surface of the release layer 3 (see (1) of FIG. 2) or travel diagonally to the release layer 3. As for the irradiation with the light 8, substantially the entire surface of the release layer 3 may be irradiated with the light 8 at a time or the surface of the release layer 3 may be scanned with the light 8.

The light 8 is thrown from the supporting member 4 side so that the light 8 does not affect the structures on the substrate 1. Since the light 8 is thrown from the supporting member 4 side, the light 8 is absorbed by the release layer 3 and is prevented from reaching the substrate 1.

As described earlier, the release layer 3 has a property that changes when the release layer 3 is irradiated with light. Accordingly, after the irradiating step, the property of the release layer 3 has been changed and the release layer 3 has become a release layer 3' (see (2) of FIG. 2).

[5: Separating Step]

(5) of FIG. 1 and (3) of FIG. 2 illustrate the separating step. In the separating step, the supporting member 4 is separated from the substrate 1. The release layer 3', which resulted from the change in property in the irradiating step, has remarkably low strength. Therefore, the substrate 1 is easily separated from the supporting member 4 by, for example, lifting up the supporting member 4 by applying a little external force, because the release layer 3 is easily broken by the little external force.

It should be noted that, although (3) of FIG. 2 is illustrated such that the separation occurs between the supporting member 4 and the release layer 3, where the separation occurs is not limited to such. The separation may occur between the release layer 3 and the adhesive layer 2.

[6: Washing Step]

(6) of FIG. 1 illustrates the washing step. In the washing step, the adhesive layer 2 remaining on the substrate 1 after the supporting member 4 is separated is removed. The adhesive layer 2 can be removed by, for example, spraying, to the adhesive layer 2, a solvent for dissolving the adhesive layer 2. This makes it possible to obtain the substrate 1 from which the adhesive layer 2 has been removed.

Note here that, after the separation of the supporting member 4, there is a possibility that a residue of the release layer 3' remains on the adhesive layer 2. If the amount of the residue of the release layer 3' is small, the residue can be removed together with the adhesive layer 2 by spraying a solvent for dissolving the adhesive layer 2 as described above. Alternatively, it is possible to employ a process in which a solvent for dissolving the release layer 3' is sprayed first and thereafter a solvent for dissolving the adhesive layer 2 is sprayed.

In the foregoing descriptions, the present invention was specifically discussed on the basis of Embodiments. The present invention is not limited to the descriptions of the respective embodiments, but may be altered within the scope of the claims. An embodiment derived from a proper combination of technical means disclosed in different embodiments is encompassed in the technical scope of the invention.

The present invention is described in more detail on the basis of Examples below. Note, however, that the present invention is not limited to such Examples.

EXAMPLES

Example 1

(1: Conditions for Layer Formation)

First, a dummy silicon substrate was set in a plasma processing apparatus for an 8-inch substrate, and oxygen plasma ashing was used to clean a reaction chamber for 10 minutes. The reaction chamber of the plasma processing apparatus was made of quartz, and the number of turns in a coiled electrode of the plasma processing apparatus was three. Next, an 8-inch glass substrate, which serves as a supporting member 4, was set in the plasma processing apparatus, and oxygen plasma ashing was used to clean the supporting member 4 and preheat the supporting member 4 for 5 minutes. After that, a release layer 3 was formed under the conditions shown in Table 1. The conditions shown in Table 1 are such that (i) the base condition is as follows: a reactive gas is $C_4F_8$ supplied at a flow rate of 200 sccm, pressure is 500 mTorr, high-frequency power is 1500 W and layer formation temperature is 240° C. and (ii) the other conditions are different in some parameter(s) from the base condition. It should be noted that, under the condition where the power was 1200 W, the time was short because discharge was unstable.

TABLE 1

| Reaction gas | $C_4F_8$ | $C_4F_8$ | $C_4F_8$ | $C_4F_8$ | $C_4F_8/CH_4$ | $C_4F_8/CH_4$ | $C_4F_8$ | $C_4F_8$ | $C_4F_8/O_2$ | $C_4F_8/O_2$ |
|---|---|---|---|---|---|---|---|---|---|---|
| Flow rate (sccm) | 200 | 200 | 200 | 200 | 200/5 | 200/10 | 200 | 200 | 200/5 | 200/10 |

TABLE 1-continued

| Reaction gas | $C_4F_8$ | $C_4F_8$ | $C_4F_8$ | $C_4F_8$ | $C_4F_8/CH_4$ | $C_4F_8/CH_4$ | $C_4F_8$ | $C_4F_8$ | $C_4F_8/O_2$ | $C_4F_8/O_2$ |
|---|---|---|---|---|---|---|---|---|---|---|
| Pressure (mTorr) | 500 | 500 | 500 | 500 | 500 | 500 | 500 | 500 | 500 | 500 |
| Power (W) | 1500 | 1400 | 1200 | 1000 | 1500 | 1500 | 1500 | 1500 | 1500 | 1500 |
| Time (sec) | 750 | 750 | 413 | 750 | 600 | 600 | 750 | 750 | 600 | 600 |
| Layer Formation Temperature | 240 | 240 | 240 | 240 | 240 | 240 | 240 | 240 | 240 | 240 |

(2: Evaluation of Speed of Layer Formation)

Figure 8:
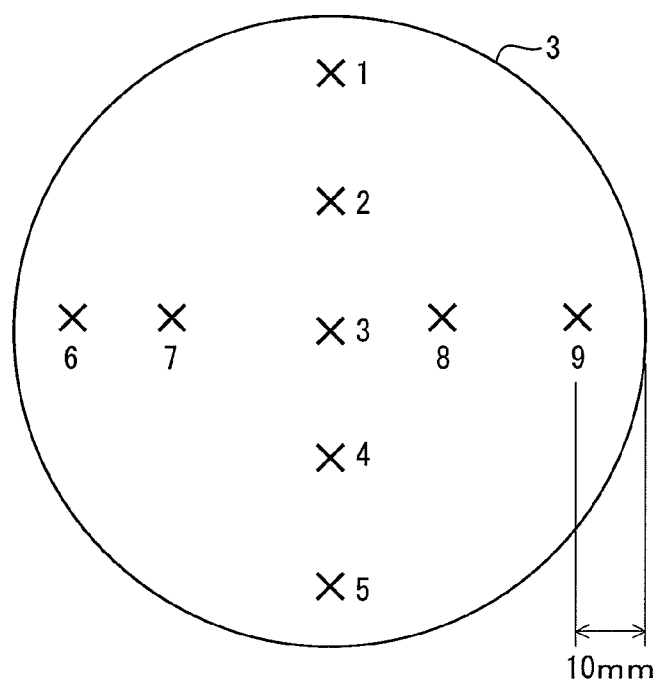
FIG. 8 schematically illustrates where on the release layer the thickness and the amount of light leakage are measured.

The release layer 3, which was being formed, was measured for the speed of formation by measuring the thickness thereof with the use of an optical interference based thickness measurement apparatus. The speed was measured at positions 1 to 9 illustrated in FIG. 8, and the mean was found. The results will be described later.

(3: Evaluation of Hardness of Release Layer)

Figure 5:
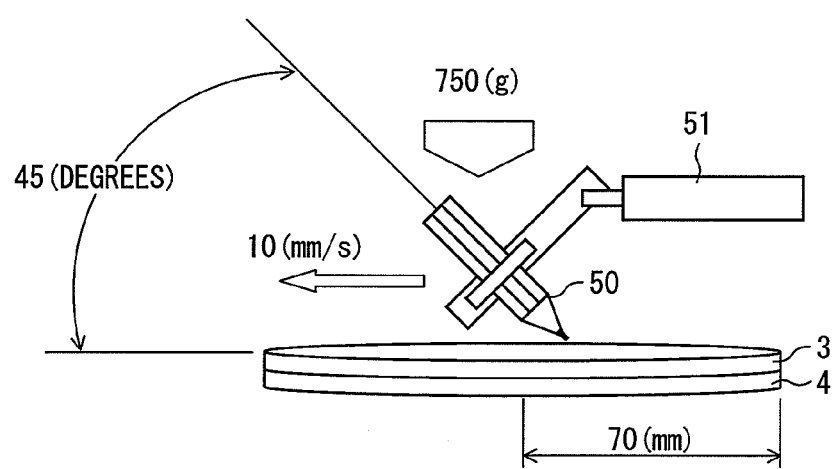
FIG. 5 schematically illustrates how the pencil hardness of a release layer is measured by a measuring method of this specification.

The obtained release layer 3 was measured for its pencil hardness by a measuring method illustrated in FIG. 5. As illustrated in FIG. 5, a pencil 50 was held by a pencil holder 51 such that the tip of the pencil 50 was in contact with the release layer 3 at an angle of 45 degrees, and a load of 750 g was applied on the pencil 50 toward the release layer 3. The pencil 50 in this state was moved at 10 mm/s within a range of 70 mm. Whether or not a large scratch resulted on the release layer 3 was checked. This process was repeated while changing the hardness of the pencil 50 to find the greatest hardness that does not leave a large scratch on the release layer 3. The greatest hardness was used as the pencil hardness of the release layer 3 thus measured. The pencil hardness thus obtained was rated on a scale of 1 to 9 shown in Table 2.

TABLE 2

| Pencil Hardness | Hardness |
|---|---|
| 3H | 9 |
| 2H | 8 |
| H | 7 |
| HB | 6 |
| B | 5 |
| 2B | 4 |
| 3B | 3 |
| 4B | 2 |
| 5B | 1 |

Figure 6:
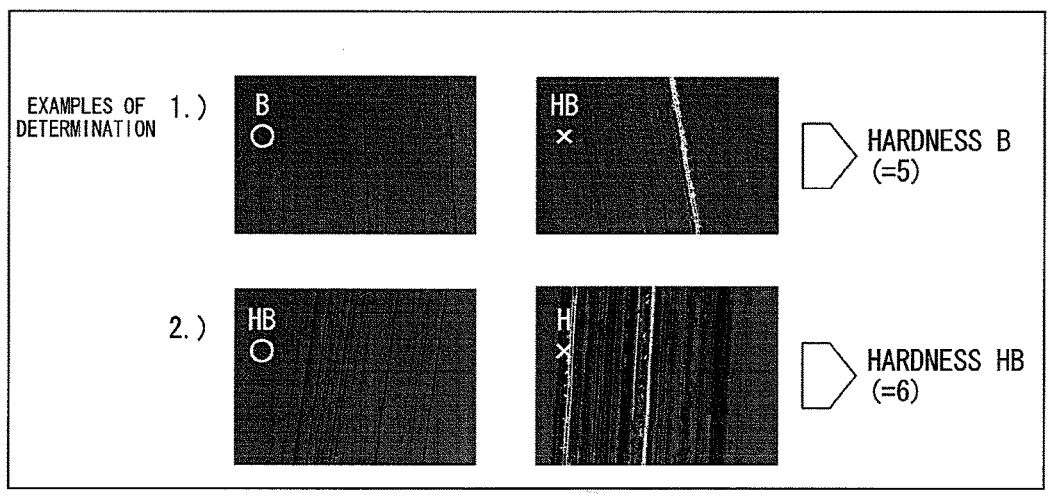
FIG. 6 shows examples of how to determine the pencil hardness of the release layer by the measuring method of this specification.

FIG. 6 shows examples of how to determine hardness. In a case where no large scratches result on the release layer 3 when a "B" pencil 50 is used but a large scratch results on the release layer 3 when an "HB" pencil 50 is used as shown in 1.) of FIG. 6, the pencil hardness is "B". This means that the hardness is 5. On the other hand, in a case where no large scratches result on the release layer 3 when the "HB" pencil 50 is used but a large scratch results on the release layer 3 when an "H" pencil 50 is used as shown in 2.) of FIG. 6, the pencil hardness is "HB". This means that the hardness is 6. The results will be described later.

(4: Evaluation of Light-blocking Property of Release Layer)

Figure 7:
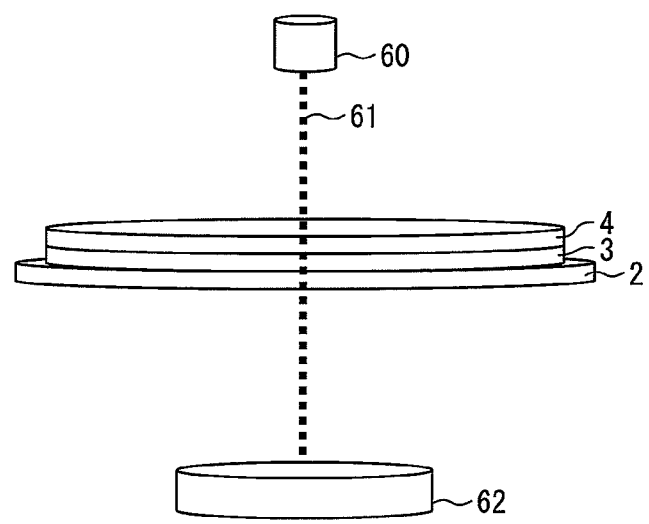
FIG. 7 illustrates a method for measuring the amount of light leakage in a release layer.

The amount of light leakage in the release layer was measured with a system of measurement arranged as illustrated in FIG. 7. The smaller the amount of light leakage, the greater the light-blocking property. As illustrated in FIG. 7, a laser beam 61 having a wavelength of 532 nm, pulse of 40 kHz and power of 1800 mW, which was emitted from a laser source 60, was caused to enter the supporting member 4 on which the release layer 3 is formed, and the amount of light that passed through the release layer 3 (i.e., the amount of light leakage) was measured by a sensor 62. On the release layer 3, a dummy adhesive (hydrocarbon adhesive) was applied in advance so that the thickness of the adhesive was 80 μm. The distance between the laser source 60 and the release layer 3 was 350 mm, and the distance between the release layer 3 and the sensor 62 was 60 mm. The amount of light leakage was measured at each position illustrated in FIG. 8, and the mean of the amounts of light leakage was found for each thickness. The results will be described later. It should be noted that the amount of light leakage obtained when the supporting member 4 alone was measured was 200 mW.

(5: Study on Mode Jump)

At which power a mode jump occurs was examined while changing a high-frequency current applied to the coiled electrode. As a result, it was found that a mode jump occurs between 1270 W and 1300 W (see Table 3).

TABLE 3

| | Power(W) | | | | | | | | |
|---|---|---|---|---|---|---|---|---|---|
| | 1150 | 1170 | 1220 | 1250 | 1270 | 1300 | 1320 | 1350 | 1400 |
| Mode | CCP | CCP | CCP | CCP | CCP | ICP | ICP | ICP | ICP |

Figure 9:
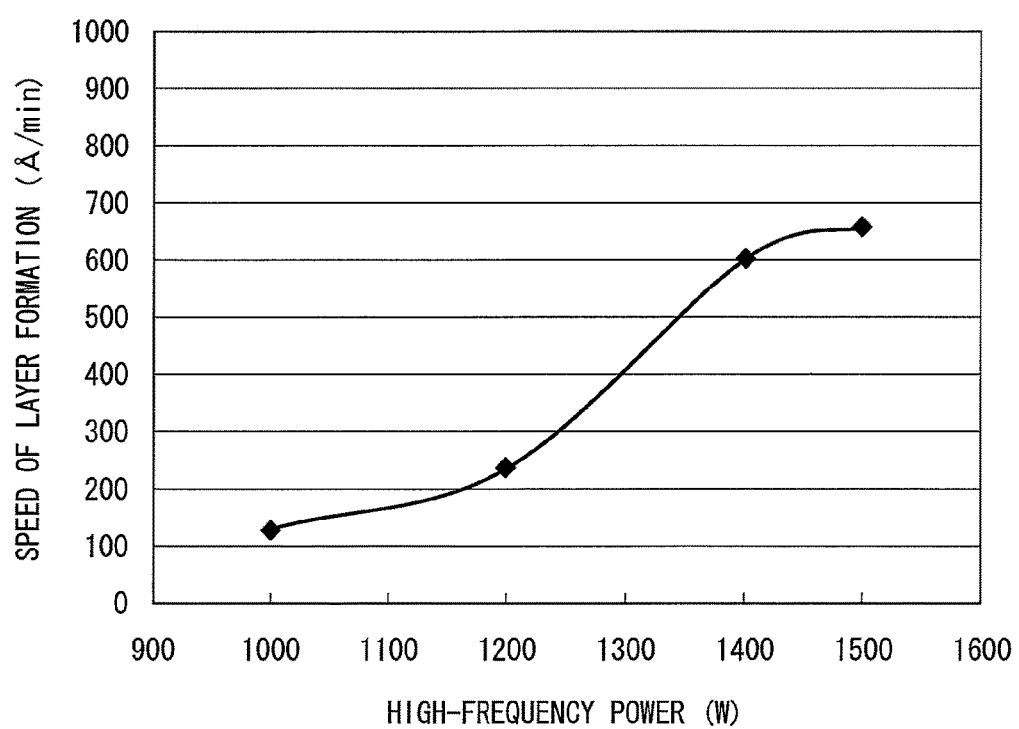
FIG. 9 is a graph showing the relationship between high-frequency power and the speed of layer formation when plasma CVD is carried out.

FIG. 9 is a graph showing the relationship between high-frequency power and the speed of layer formation when plasma CVD is carried out. The vertical axis shows the speed of layer formation (angstrom/min), whereas the horizontal axis shows high-frequency power (W). As shown in FIG. 9, the speed of layer formation significantly improved when the applied power was higher than the power at which a mode jump occurs (i.e., when the applied power was equal to or higher than 1300 W).

Figure 10:
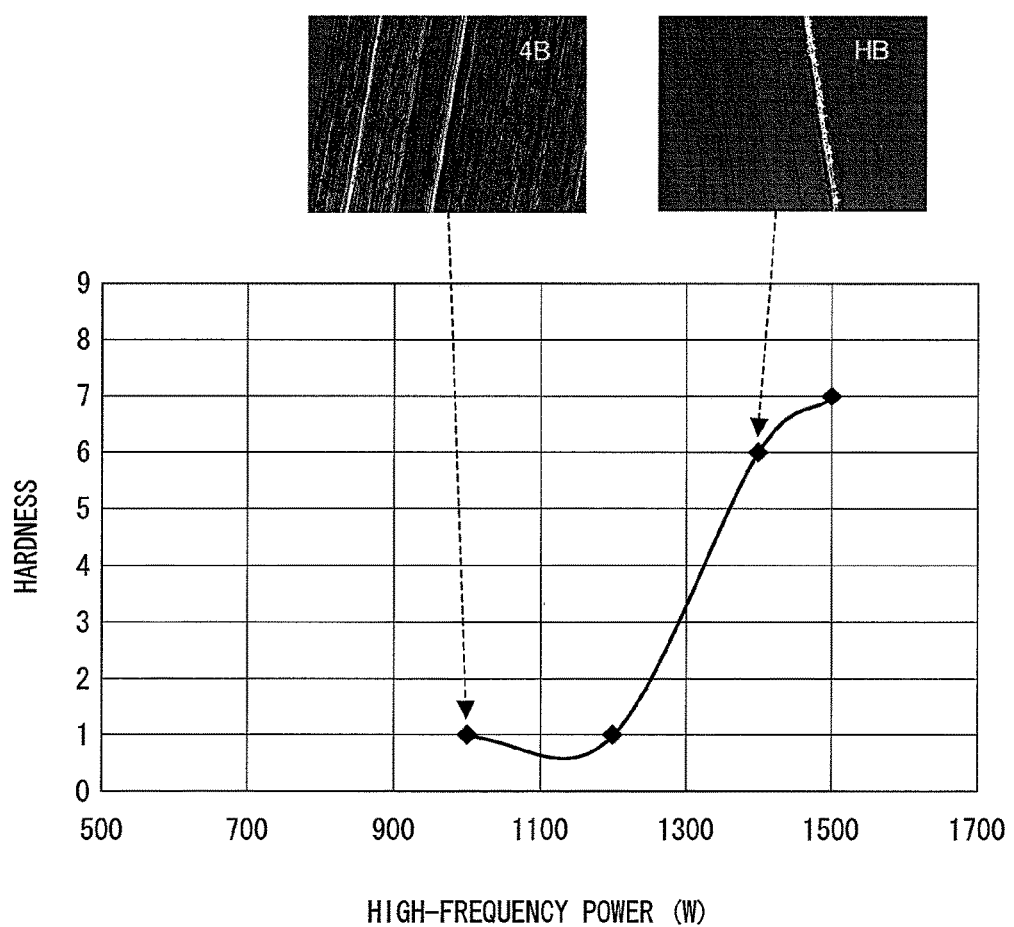
FIG. 10 is a graph showing the relationship between high-frequency power and the hardness of a release layer when plasma CVD is carried out.

FIG. 10 is a graph showing the relationship between high-frequency power and the hardness of a release layer when plasma CVD is carried out. The vertical axis shows the hardness of the release layer measured by the foregoing measuring method, whereas the horizontal axis shows high-frequency power (W). As shown in FIG. 10, when the applied power was higher than the power at which a mode jump occurs (i.e., when the applied power was equal to or higher than 1300 W), the hardness of the release layer significantly improved and it was possible to form a release layer 3 having a hardness of equal to or greater than 6 (pencil hardness HB) which successfully prevents scratches on the release layer 3 in the bonding step.

At powers below the power at which a mode jump occurs (i.e., at powers lower than 1300 W), the resulting release layer 3 was an unsubstantial film which had low adhesion to the supporting member 4, and a lot of particles were generated.

Figure 11:
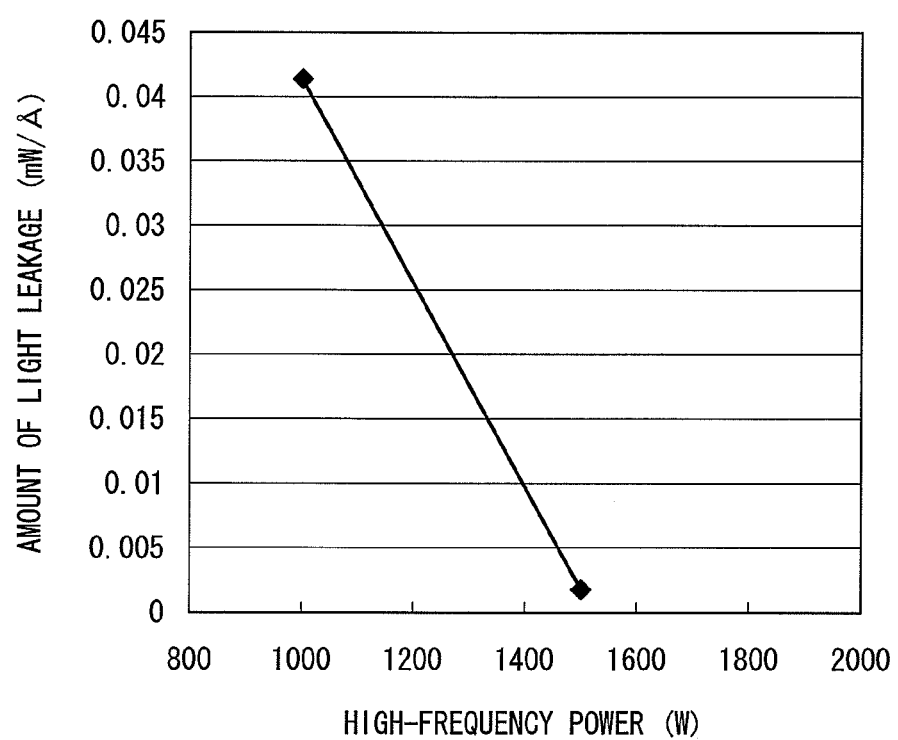
FIG. 11 is a graph showing the relationship between high-frequency power and the light-blocking property of a release layer when plasma CVD is carried out.
Figure 12:
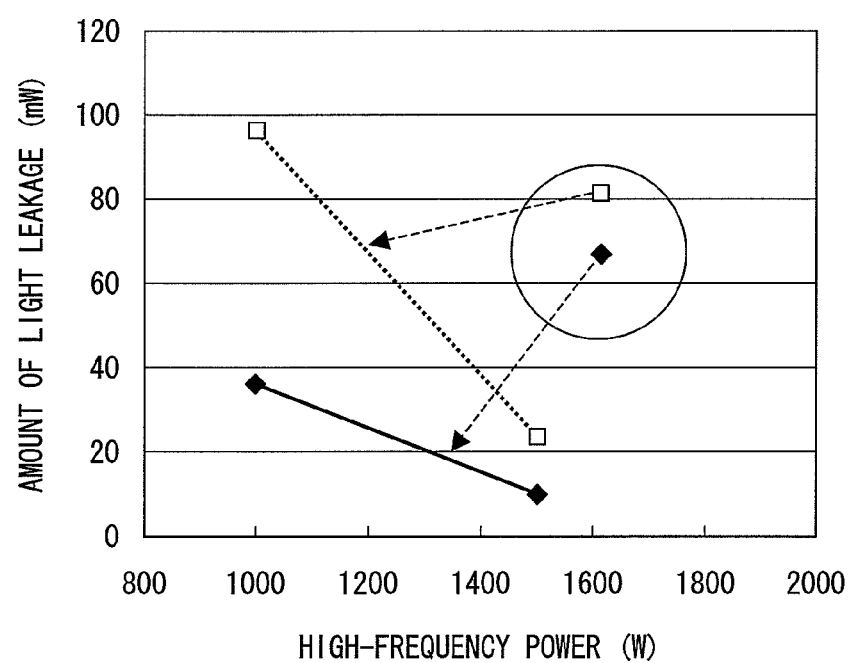
FIG. 12 is a graph showing the relationship between high-frequency power and the light-blocking property of a release layer at each position when plasma CVD is carried out.

FIG. 11 is a graph showing the relationship between high-frequency power and the light-blocking property of the release layer when plasma CVD is carried out. The vertical axis shows the mean of the amounts of light leakage for each thicknesses (mW/angstrom), whereas the horizontal axis shows high-frequency power (W). FIG. 12 is a graph showing the relationship between high-frequency power and the light-blocking property of the release layer at each position when plasma CVD is carried out. The vertical axis shows the amount of light leakage at each position (mW), whereas the horizontal axis shows high-frequency power (W). As shown in FIGS. 11 and 12, when the applied power was higher than the power at which a mode jump occurs (i.e., when the applied power was equal to or greater than 1300 W), the release layer 3 had a great light-blocking property. Specifically, a peripheral portion of the release layer 3 formed at a power lower than the power at which a mode jump occurs (i.e., at a power lower than 1300 W) transmitted approximately 50% of a laser beam, whereas a peripheral portion of the release layer 3 formed at a power higher than the power at which a mode jump occurs (i.e., at a power equal to or higher than 1300 W) transmitted only 20% or less of a laser beam.

As has been described, it was found that, by carrying out plasma CVD with a power higher than the power at which a mode jump occurs, it is possible to improve the speed of formation of the release layer 3, the hardness of the release layer 3 and the light-blocking property of the release layer 3.

(6: Study on Layer Formation Temperature)

Figure 13:
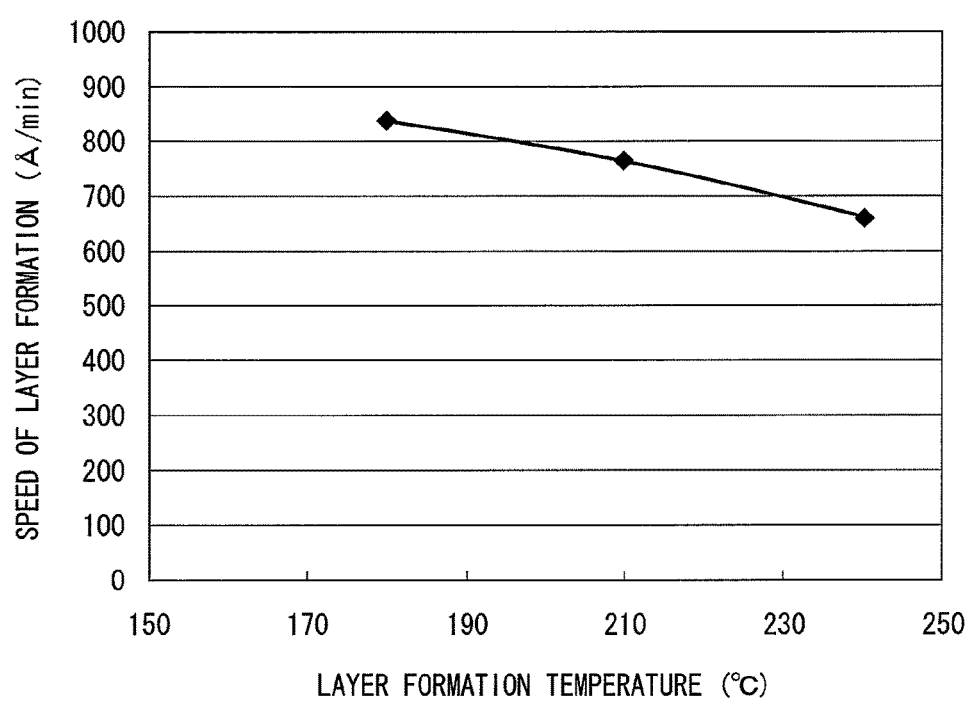
FIG. 13 is a graph showing the relationship between the temperature at which a release layer is formed and the speed of formation of the release layer when plasma CVD is carried out.

FIG. 13 is a graph showing the relationship between layer formation temperature and the speed of layer formation when plasma CVD is carried out. The vertical axis shows the speed of layer formation (angstrom/min), whereas the horizontal axis shows layer formation temperature (i.e., the temperature of a stage where the supporting member 4 is placed). As shown in FIG. 13, the lower the layer formation temperature (in particular, equal to or lower than 180° C.), the more the speed of layer formation improved.

Figure 14:
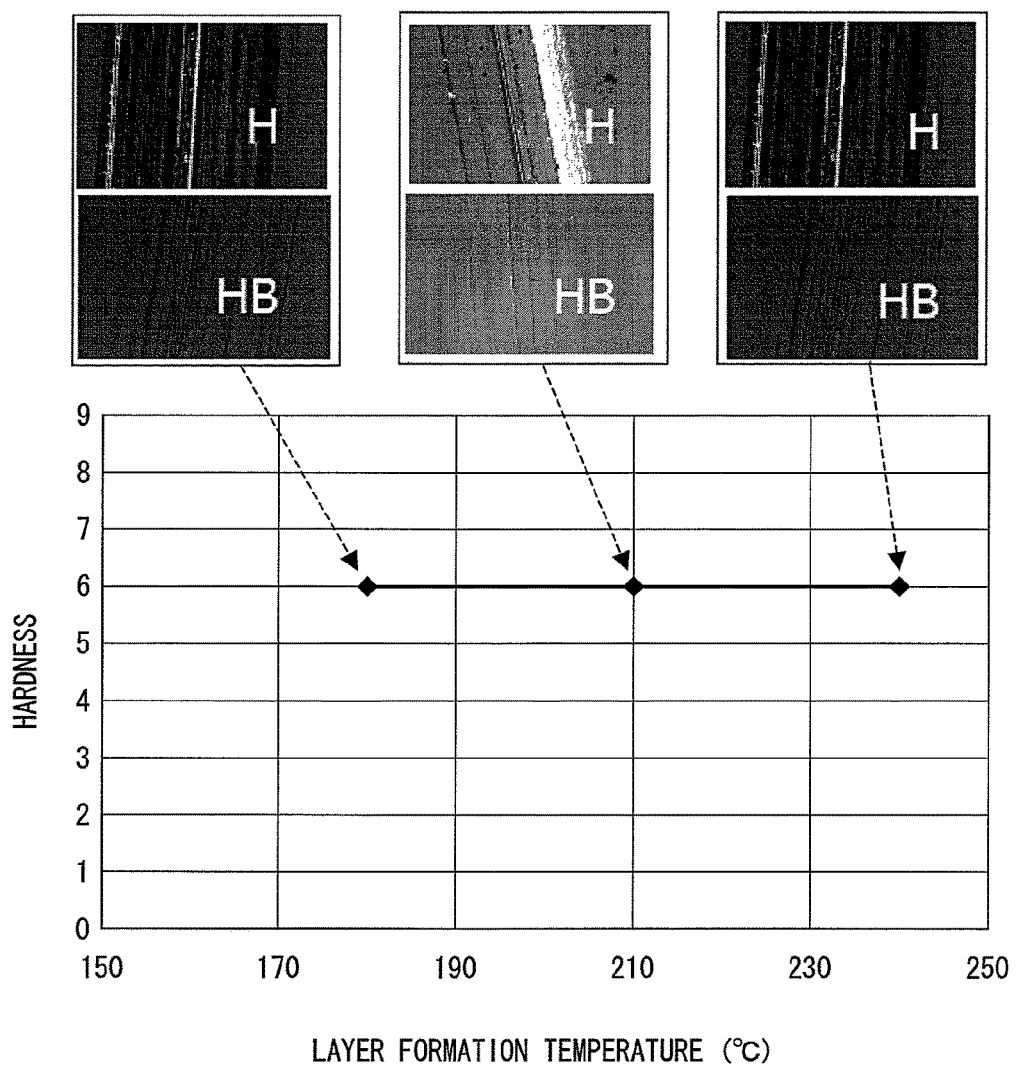
FIG. 14 is a graph showing the relationship between the temperature at which a release layer is formed and the hardness of the release layer when plasma CVD is carried out.

FIG. 14 is a graph showing the relationship between the layer formation temperature and the hardness of the release layer when plasma CVD is carried out. The vertical axis shows the hardness of the release layer measured by the foregoing measuring method, whereas the horizontal axis shows the layer formation temperature. As shown in FIG. 14, the hardness of the release layer 3 remained about the same regardless of the layer formation temperature.

Figure 15:
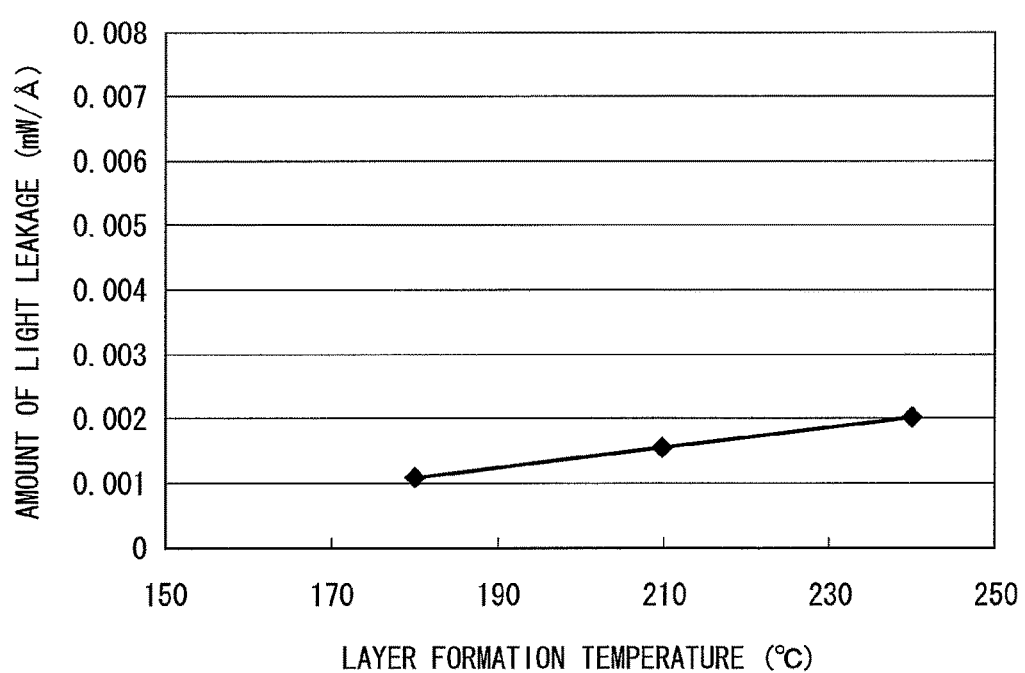
FIG. 15 is a graph showing the relationship between the temperature at which a release layer is formed and the light-blocking property of the release layer when plasma CVD is carried out.
Figure 16:
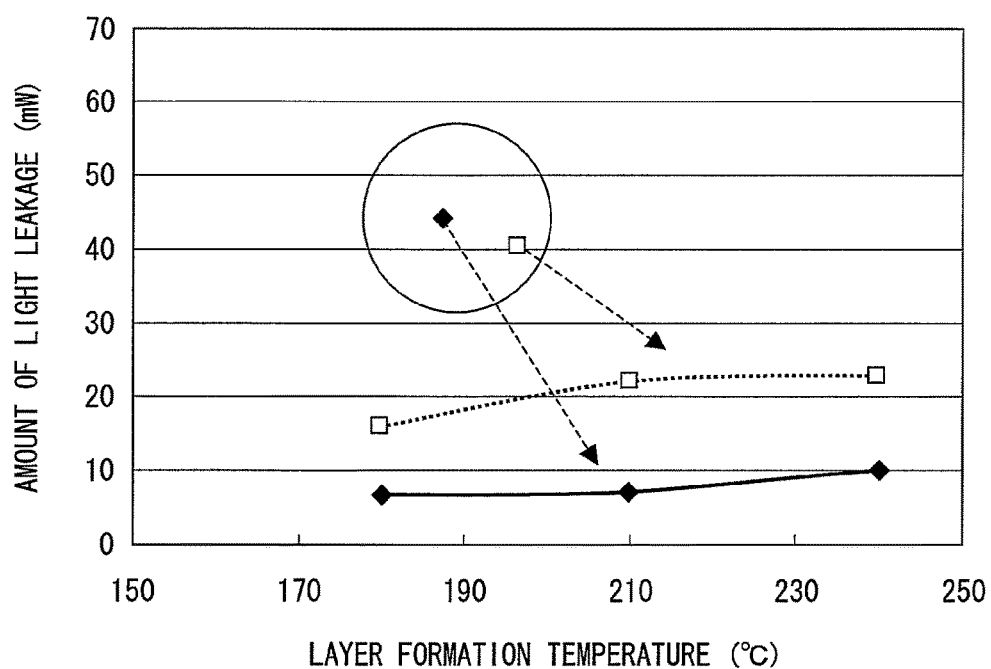
FIG. 16 is a graph showing the relationship between the temperature at which a release layer is formed and the light-blocking property of the release layer at each position when plasma CVD is carried out.

FIG. 15 is a graph showing the relationship between layer formation temperature and the light-blocking property of the release layer when plasma CVD is carried out. The vertical axis shows the mean of the amounts of light leakage for each thickness (mW/angstrom), whereas the horizontal axis shows layer formation temperature. FIG. 16 is a graph showing the relationship between layer formation temperature and the light-blocking property of the release layer at each position when plasma CVD is carried out. The vertical axis shows the amount of light leakage (mW) at each position, whereas the horizontal axis shows layer formation temperature. As shown in FIGS. 15 and 16, the lower the layer formation temperature (particularly, equal to or lower than 180° C.), the more the light-blocking property improved.

As has been described, it was found that, when the layer formation temperature is low (in particular, equal to or lower than 180° C.), it is possible to improve the speed of formation of the release layer 3 and the light-blocking property of the release layer 3.

(7: Study on Addition of Hydrocarbon Gas)

Figure 17:
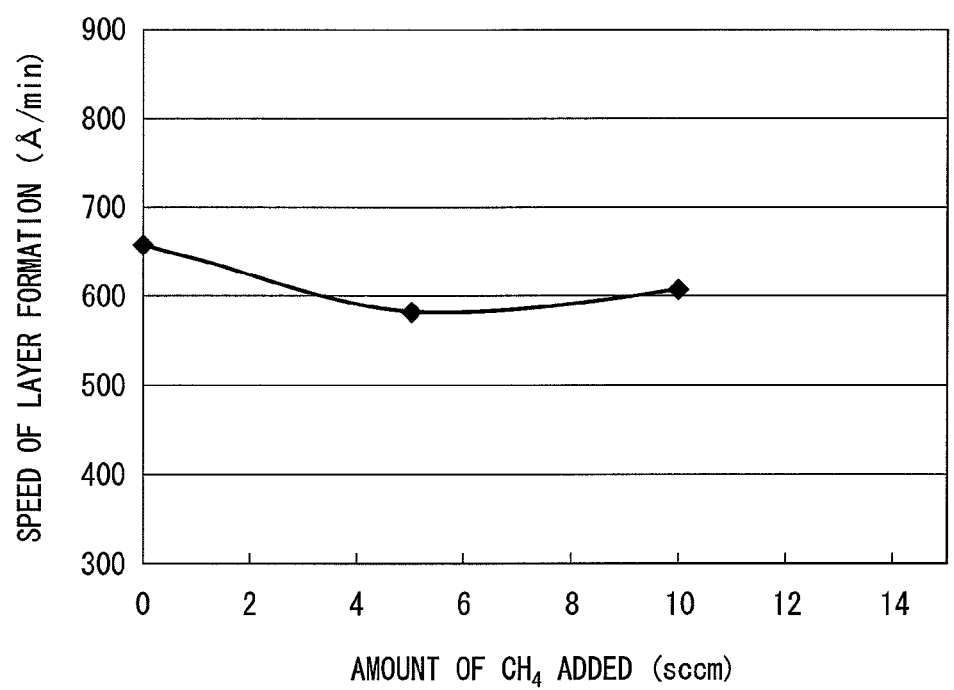
FIG. 17 is a graph showing the relationship between the amount of $CH_4$ added and the speed of layer formation when plasma CVD is carried out.

FIG. 17 is a graph showing the relationship between the amount of $CH_4$ added and the speed of layer formation when plasma CVD is carried out. The vertical axis shows the speed of layer formation (angstrom/min), whereas the horizontal axis shows the amount of $CH_4$ added (sccm). As shown in FIG. 17, when a layer was formed under this condition, the speed of layer formation did not change regardless of the amount of $CH_4$ added.

Figure 18:
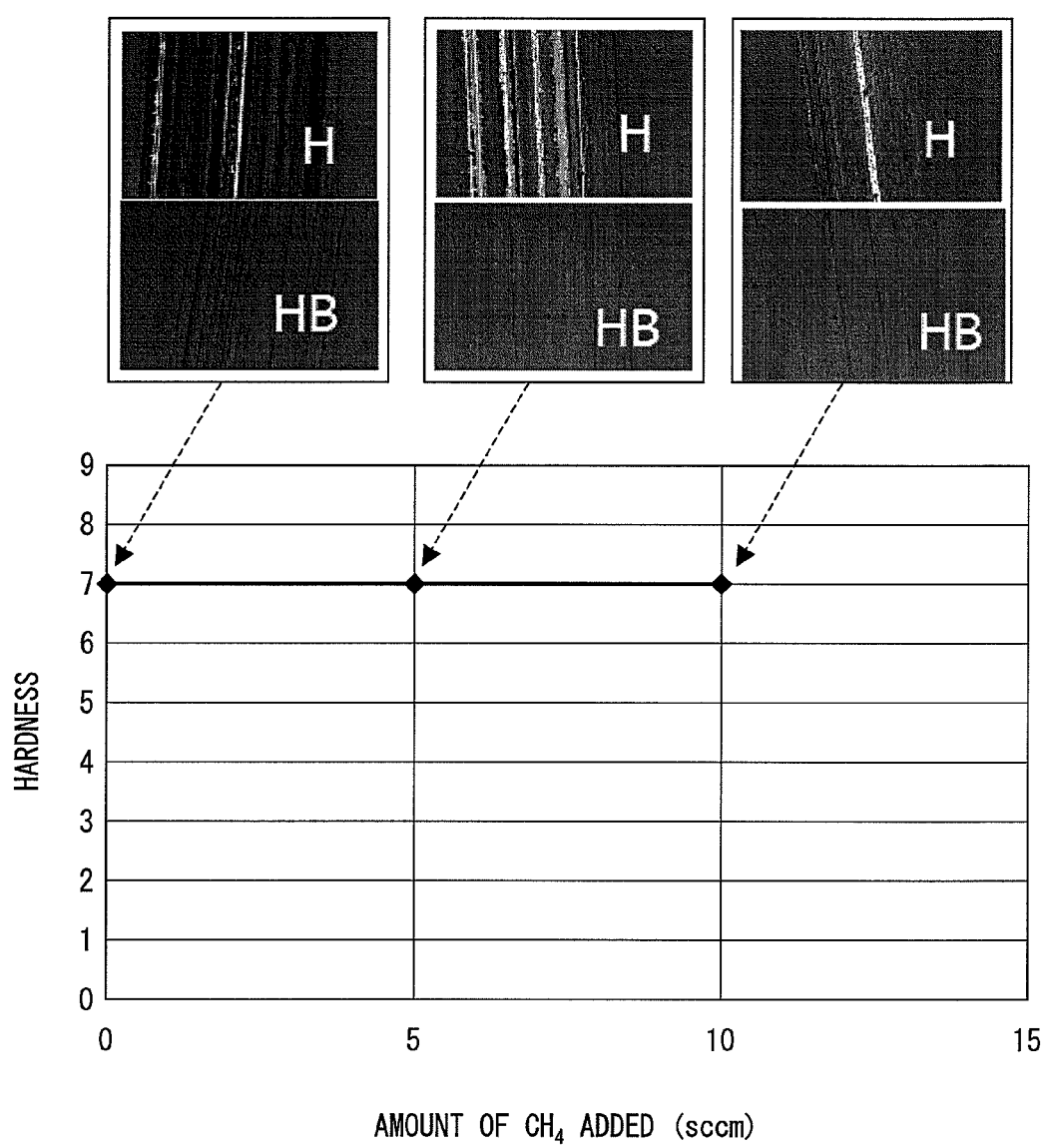
FIG. 18 is a graph showing the relationship between the amount of $CH_4$ added and the hardness of a release layer when plasma CVD is carried out

FIG. 18 is a graph showing the relationship between the amount of $CH_4$ added and the hardness of the release layer when plasma CVD is carried out. The vertical axis shows the hardness of the release layer measured by the foregoing measuring method, whereas the horizontal axis shows the amount of $CH_4$ added (sccm). As shown in FIG. 18, the hardness of the release layer 3 remained about the same regardless of the amount of $CH_4$ added.

Figure 19:
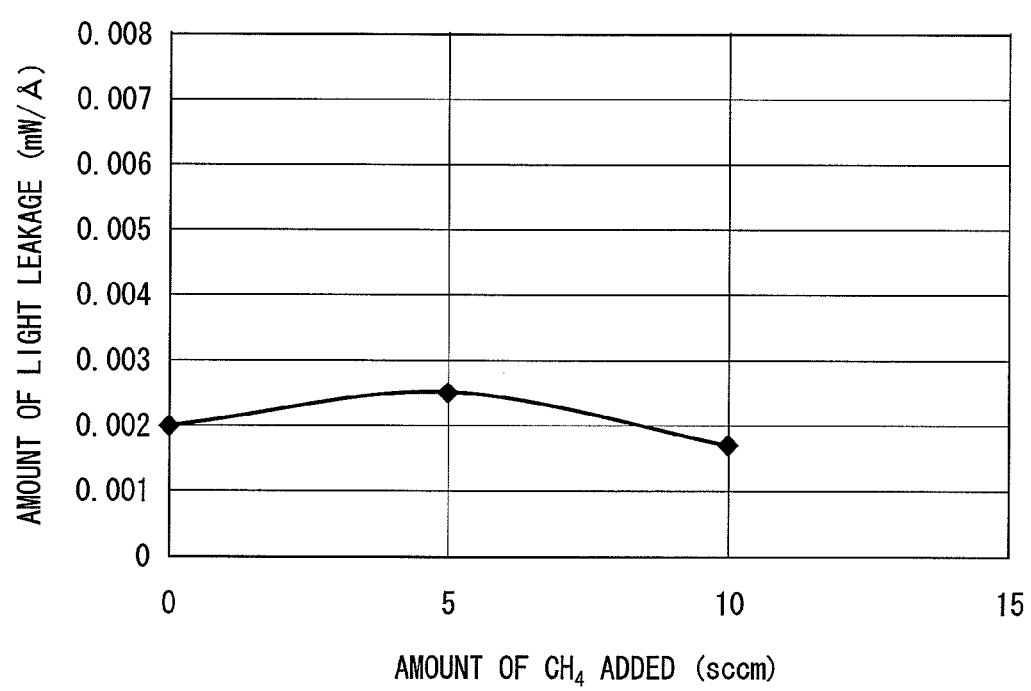
FIG. 19 is a graph showing the relationship between the amount of $CH_4$ added and the light-blocking property of a release layer when plasma CVD is carried out.
Figure 20:
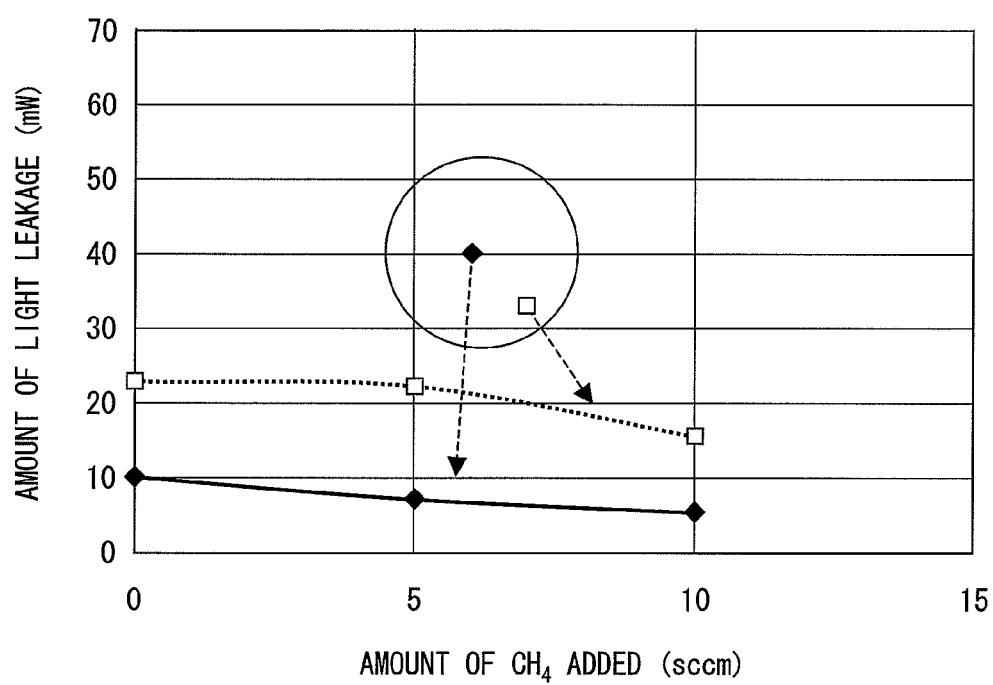
FIG. 20 is a graph showing the relationship between the amount of $CH_4$ added and the light-blocking property of a release layer at each position when plasma CVD is carried out.

FIG. 19 is a graph showing the relationship between the amount of $CH_4$ added and the light-blocking property of the release layer when plasma CVD is carried out. The vertical axis shows the mean of the amounts of light leakage for each thicknesses (mW/angstrom), whereas the horizontal axis shows the amount of $CH_4$ added (sccm). FIG. 20 is a graph showing the relationship between the amount of $CH_4$ added and the light-blocking property of the release layer at each position when plasma CVD is carried out. The vertical axis shows the amount of light leakage at each position (mW), whereas the horizontal axis shows the amount of $CH_4$ added (sccm). As shown in FIGS. 19 and 20, when a layer was formed under this condition, the light-blocking property did not change regardless of the amount of $CH_4$ added.

As has been described, under this condition, the amount of $CH_4$ did not have a significant effect. In view of the circumstances, the plasma processing apparatus was changed to a plasma processing apparatus for a 12-inch substrate, and the effect of the amount of $CH_4$ added was studied again. The supporting member 4 used here was a 12-inch glass substrate. Furthermore, high-frequency power (2500 W) higher than the power at which a mode jump occurs was used in the plasma processing apparatus. Other values were the same as those in the foregoing base condition. In this way, plasma CVD was carried out.

Figure 26:
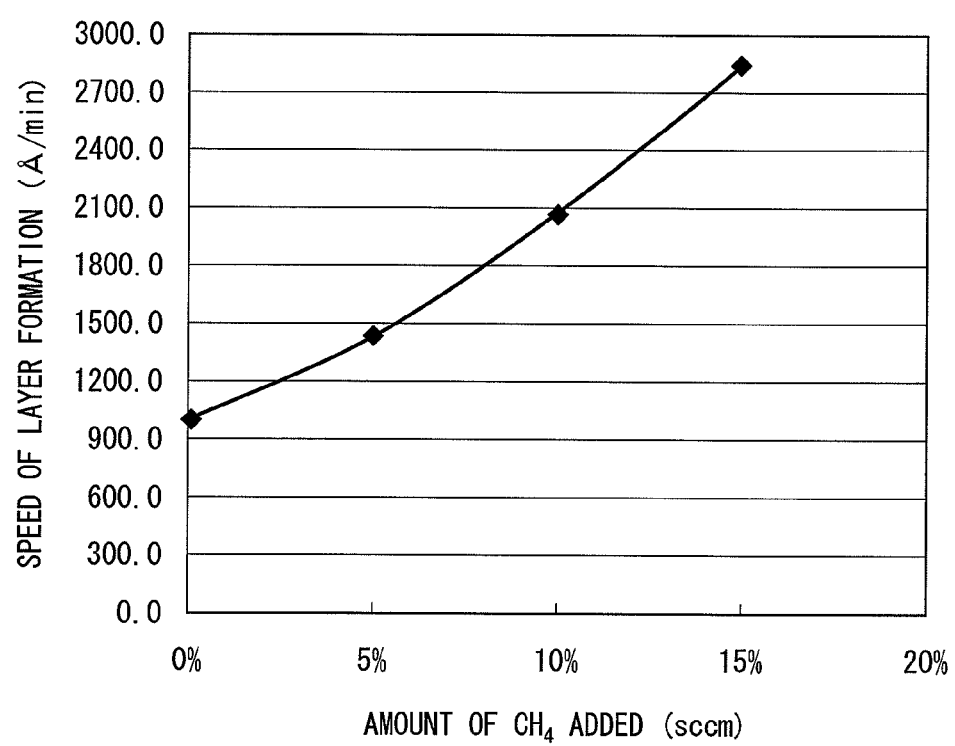
FIG. 26 is a graph showing the relationship between the amount of $CH_4$ added and the speed of layer formation when plasma CVD is carried out.

FIG. 26 is a graph showing the relationship between the amount of $CH_4$ added and the speed of layer formation when plasma CVD is carried out. The vertical axis shows the speed of layer formation (angstrom/min), whereas the horizontal axis shows the amount of $CH_4$ added (sccm). As shown in FIG. 26, when a layer was formed under this condition, the speed of layer formation improved as the amount of $CH_4$ added was increased.

Figure 27:
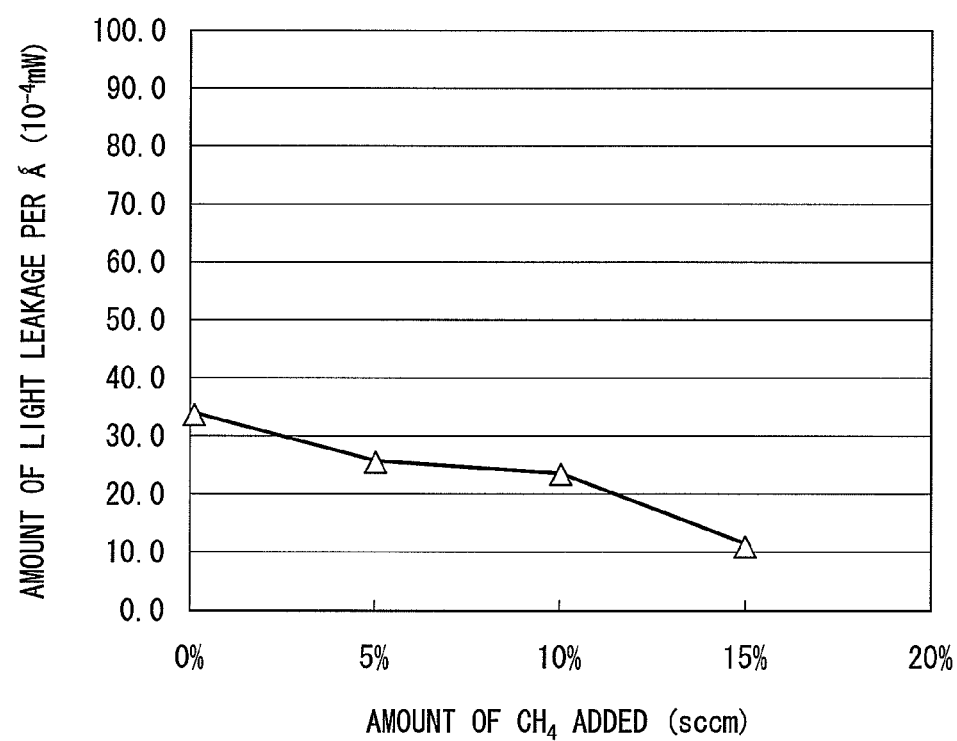
FIG. 27 is a graph showing the relationship between the amount of $CH_4$ added and the light-blocking property of a release layer when plasma CVD is carried out.

FIG. 27 is a graph showing the relationship between the amount of $CH_4$ added and the light-blocking property of the release layer when plasma CVD is carried out. The vertical axis shows the mean of the amounts of light leakage per angstrom of thicknesses ($10^{-4}$ mW), whereas the horizontal axis shows the amount of $CH_4$ added (sccm). As shown in FIG. 27, when a layer was formed under this condition, the light-blocking property improved as the amount of $CH_4$ added was increased.

As has been described, it was found that, by adding $CH_4$, it is possible to improve the speed of formation of the light release layer 3 and the light-blocking property of the light release layer 3.

(8: Study on Effect of Oxygen)

Figure 21:
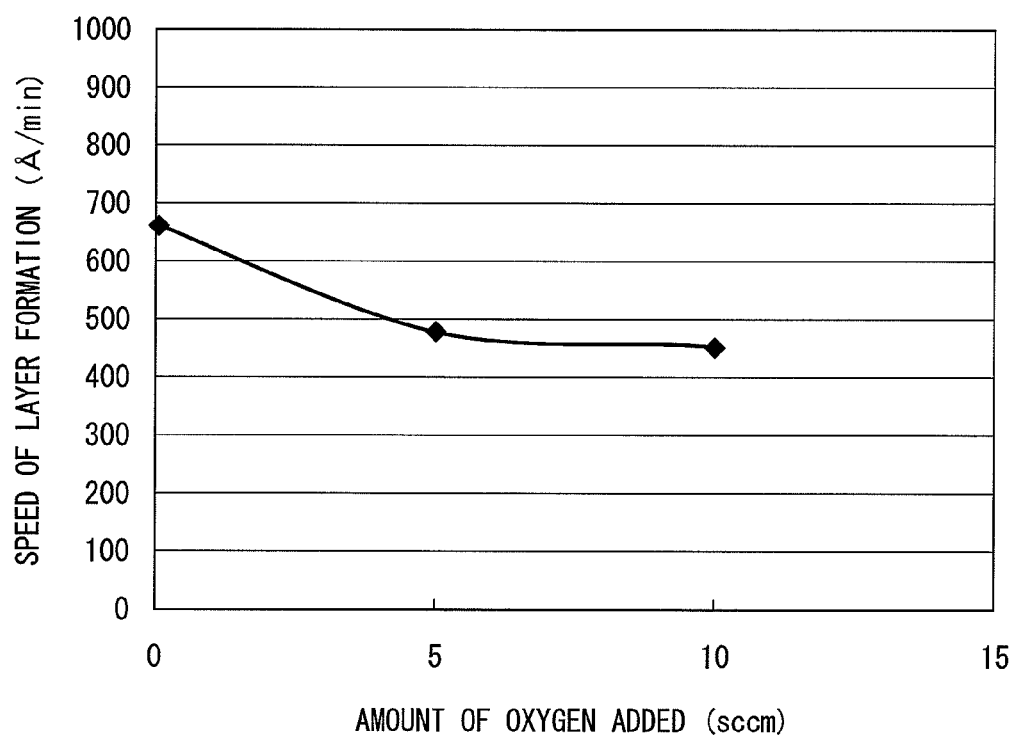
FIG. 21 is a graph showing the relationship between the amount of oxygen added and the speed of layer formation when plasma CVD is carried out.

FIG. 21 is a graph showing the relationship between the amount of oxygen added and the speed of layer formation when plasma CVD is carried out. The vertical axis shows the speed of layer formation (angstrom/min), whereas the horizontal axis shows the amount of oxygen added (sccm). As shown in FIG. 21, when a layer was formed under this condition, the speed of layer formation somewhat decreased by the addition of oxygen.

Figure 22:
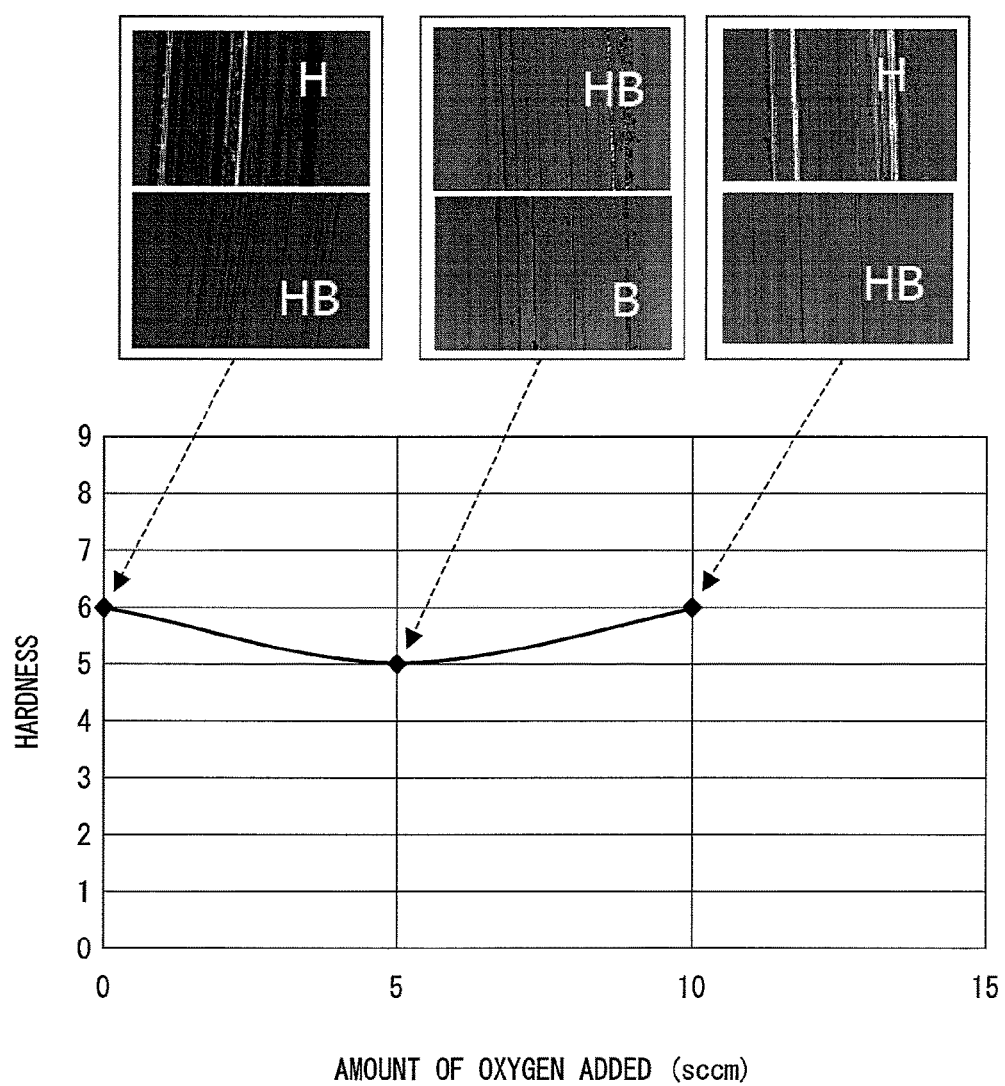
FIG. 22 is a graph showing the relationship between the amount of oxygen added and the hardness of a release layer when plasma CVD is carried out.

FIG. 22 is a graph showing the relationship between the amount of oxygen added and the hardness of the release layer when plasma CVD was carried out. The horizontal axis shows the hardness of the release layer measured by the foregoing measuring method, whereas the horizontal axis shows the amount of oxygen added (sccm). As shown in FIG. 22, the hardness of the release layer remained about the same regardless of the amount of oxygen added.

Figure 23:
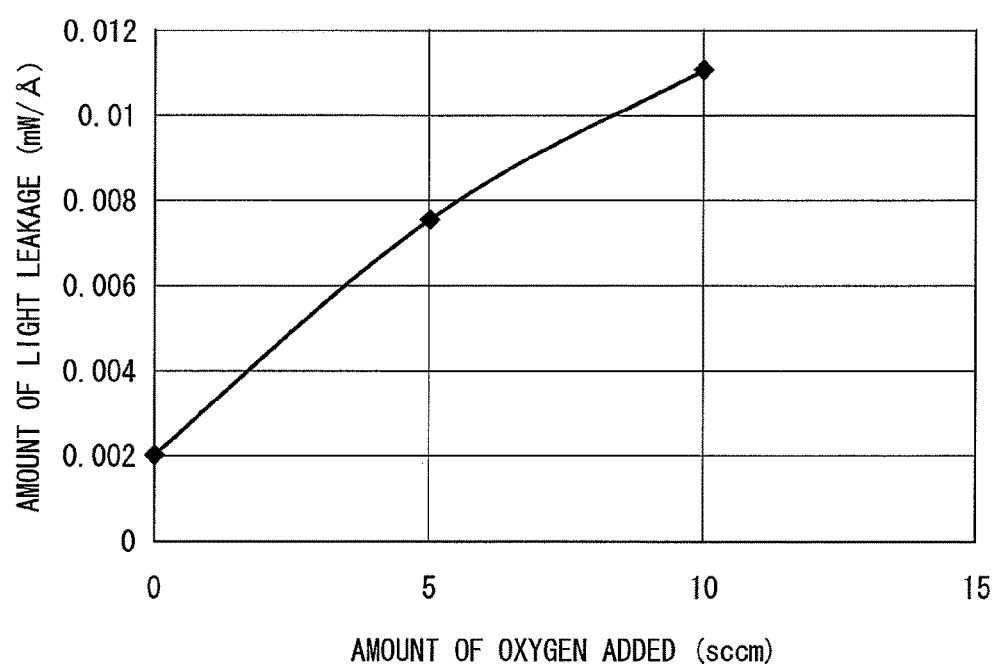
FIG. 23 is a graph showing the relationship between the amount of oxygen added and the light-blocking property of a release layer when plasma CVD is carried out.
Figure 24:
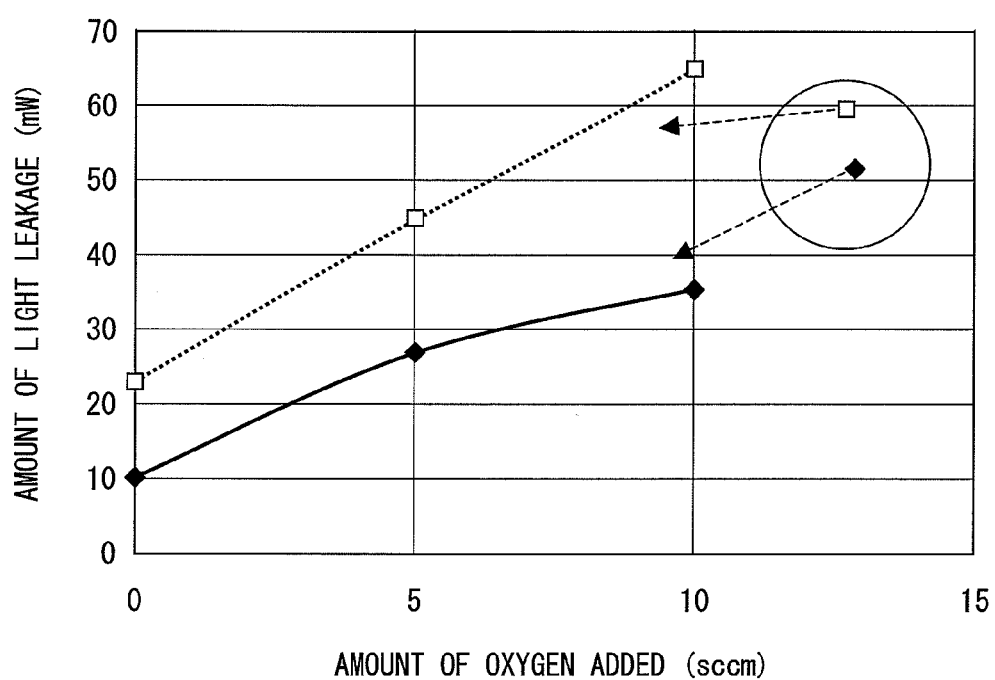
FIG. 24 is a graph showing the relationship between the amount of oxygen added and the light-blocking property of a release layer at each position when plasma CVD is carried out.

FIG. 23 is a graph showing the relationship between the amount of oxygen added and the light-blocking property of the release layer when plasma CVD was carried out. The vertical axis shows the mean of the amounts of light leakage for each thickness (mW/angstrom), whereas the horizontal axis shows the amount of oxygen added (sccm). FIG. 24 is a graph showing the relationship between the amount of oxygen added and the light-blocking property of the release layer at each position when plasma CVD was carried out. The vertical axis shows the amount of light leakage at each position (mW), whereas the horizontal axis shows the amount of oxygen added (seem). As shown in FIGS. 23 and 24, when a layer was formed under this condition, the light-blocking property significantly decreased by the addition of oxygen.

As has been described, when oxygen was added, the speed of formation of the release layer 3 and the light-blocking property of the release layer 3 decreased. A further study was conducted on this.

First, the release layer 3 formed was subjected to oxygen ashing, and plasma spectrum was measured. As a result, peaks representing $CF_2$ and CO were observed. This shows that the release layer 3 is decomposed into $CF_2$ and CO by oxygen ashing, and also indirectly means that $O_2$ adversely affects plasma CVD.

Next, plasma spectrum was measured under the condition where the reaction chamber was made of quartz, high-frequency power was 1500 W and 1200 W, and no oxygen was added. As a result, when a power (1500 W) at which a mode jump occurs was used, peaks representing $O_2$ and CO were observed. This suggests that the reaction chamber may have been etched and oxygen may have been generated. It was found from this that the material for the reaction chamber is preferably ceramics rather than quartz that may generate oxygen.

(9: Study on Degassing Property)

Figure 25:
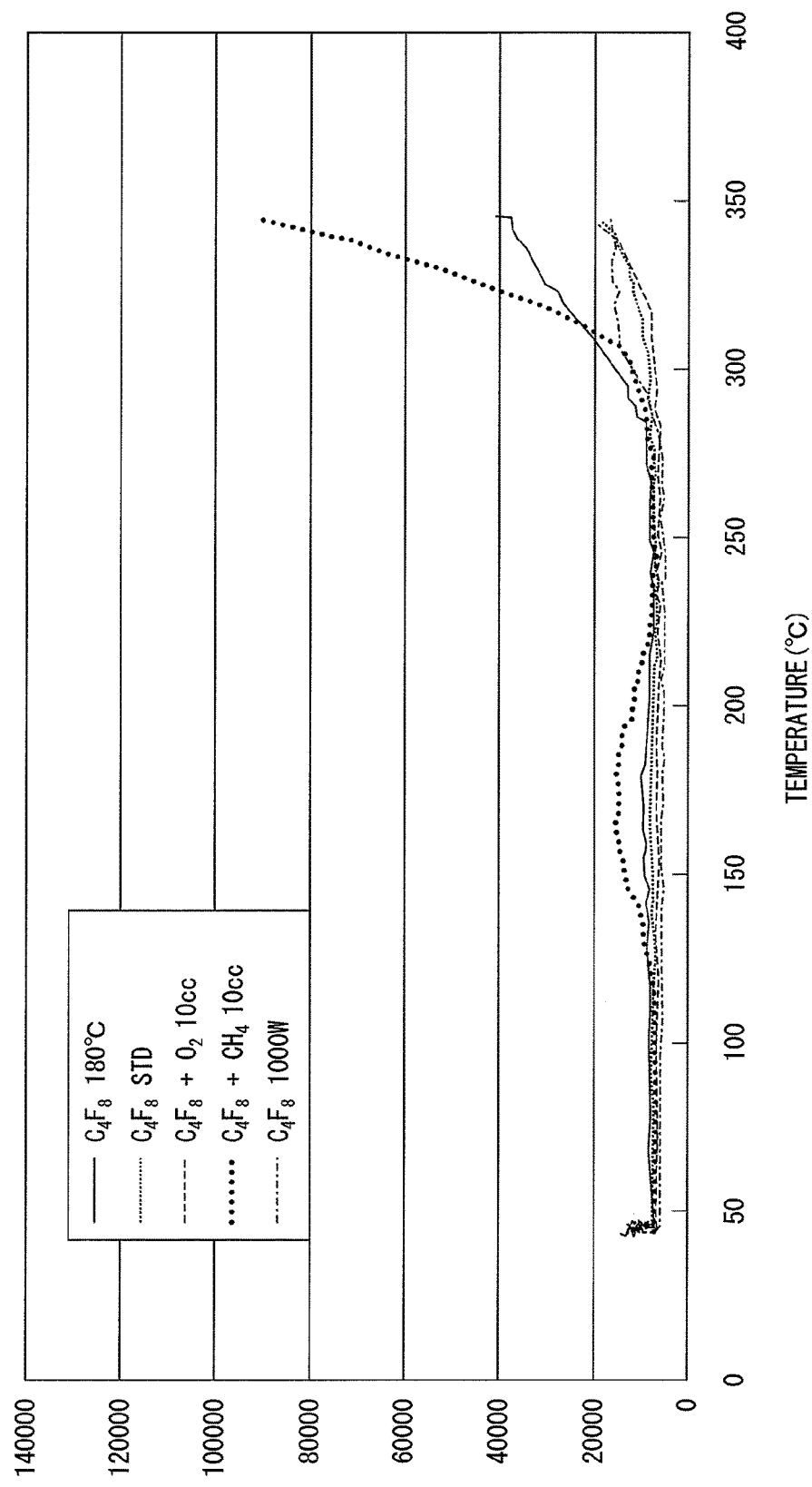
FIG. 25 is a graph showing the degassing property of release layers formed under different conditions.

Release layers 3 formed under different conditions were measured for degassing property by thermal desorption analysis (TDS). The results are shown in FIG. 25. As shown in FIG. 15, there were no particular problems in the degassing property of any of the release layers 3 formed under different conditions.

(10: Evaluation of Separability of Laminate)

The substrate 1 used here was a semiconductor wafer. A hydrocarbon adhesive was applied to the substrate 1, and was baked, thereby forming an adhesive layer 2. The adhesive layer 2 thus formed and each of the release layers 3 formed under different conditions were bonded together such that they faced each other, whereby laminates 10 corresponding to the respective conditions were prepared.

The substrate 1 of each of the laminates 10 was thinned, and thereafter the release layer 3 was irradiated with a green laser beam having a wavelength of 532 nm which came from the supporting member 4 side of the laminate 1. Specifically, the laser irradiation was carried out at a pulse frequency of 40 kHz under the condition where a beam shape was 160 μm per side, a scan pitch was 160 μm, an average power was 1.8 W, and a scan rate was 6000 mm/sec. Each laminate 10 was scanned with the green laser beam once.

As a result, all the release layers 3 of the laminates 10 corresponding to the respective conditions were found to have changed their properties upon irradiation with the laser beam. The supporting member 4 was easily separated from the substrate 1 by merely lifting up the supporting member 4. Furthermore, surfaces of the supporting member 4 and the substrate 1 separated from each other were visually inspected. As a result, no residues were found, although a small amount of the release layer 3 which changed into black powder remained on the substrate 1.

Example 2

First, a dummy 12-inch silicon substrate was set in a plasma processing apparatus for a 12-inch substrate, and oxygen plasma ashing was used to clean a reaction chamber for 10 minutes. The reaction chamber of the plasma processing apparatus was made of quartz, and the number of turns in a coiled electrode of the plasma processing apparatus was three. Next, a 12-inch glass substrate, which serves as a supporting member 4, was set in the plasma processing apparatus, and oxygen plasma ashing was used to clean the supporting member 4 and preheat the supporting member 4 for 5 minutes. After that, a release layer 3 was formed under the condition where a reactive gas was $C_4F_8$ supplied at a flow rate of 400 sccm, pressure was 70 Pa, high-frequency power was 2800 W and layer formation temperature was 240° C.

Next, separability was tested under the same conditions as in (10: Evaluation of separability of laminate) in Example 1. The supporting member 4 was easily separated from the substrate 1. At which power a mode jump occurs was examined while changing a high-frequency current applied to the coiled electrode. As a result, it was found that a mode jump occurs between 2200 W and 2800 W. Furthermore, it was found that the speed of layer formation significantly improves when the applied power is higher than the power at which a mode jump occurs (i.e., when the applied power is equal to or higher than 2200 W).

INDUSTRIAL APPLICABILITY

A method for producing a laminate, a method for processing a substrate, and a laminate in accordance with the present invention are useful particularly in the field of substrate processing.

REFERENCE SIGNS LIST

1 Substrate
2 Adhesive layer
3 Release layer
4 Supporting member
8 Light
10 Laminate
40 Plasma processing apparatus
41 Reaction chamber
42 Coiled electrode
43 High-frequency power source
44 Reactive gas supply port
45 Base
50 Pencil 51 Pencil holder
60 Laser source
61 Laser beam
62 Sensor What invention claimed is:

1. A method for producing a laminate, the laminate including (i) a substrate, (ii) a light-transmitting supporting member which supports the substrate and (iii) a release layer which lies between the substrate and the supporting member and has a property that changes when the release layer absorbs light coming through the supporting member, wherein the release layer absorbs 80% or more of light having a wavelength of 600 nm or less, wherein said method comprises forming the release layer by plasma CVD using a reactive gas containing a fluorocarbon gas as a main component; and wherein forming the release layer comprises carrying out the plasma CVD with a high-frequency power that is higher than a power at which a mode jump from E-mode plasma to H-mode plasma occurs.

2. The method according to claim 1, wherein, in forming the release layer, the plasma CVD is carried out at a layer formation temperature of 300° C. or lower.

3. The method according to claim 1, wherein, in forming the release layer, the plasma CVD is carried out in a reaction chamber made of ceramics.

4. A method for processing a substrate, comprising:
producing the laminate by the method recited in claim 1 and thereafter;
irradiating the supporting member-side of the release layer with light to thereby change the property of the release layer and thereafter;
separating the supporting member from the substrate.

5. The method according to claim 1, wherein the reactive gas contains a hydrocarbon gas as an additive gas.

6. A method for processing a substrate, comprising:
producing the laminate by a method recited in claim 2 and thereafter;
irradiating the supporting member-side of the release layer with light to thereby change the property of the release layer and thereafter;
separating the supporting member from the substrate.

7. A method for processing a substrate, comprising:
producing the laminate by a method recited in claim 3 and thereafter;
irradiating the supporting member-side of the release layer with light to thereby change the property of the release layer and thereafter;
separating the supporting member from the substrate.

* * * * *